(12) United States Patent
Huang et al.

(10) Patent No.: US 10,267,136 B2
(45) Date of Patent: Apr. 23, 2019

(54) METHODS FOR ANALYZING AND OPTIMIZING CASING WHILE DRILLING ASSEMBLIES

(71) Applicant: Schlumberger Technology Corporation, Sugar Land, TX (US)

(72) Inventors: Sujian Huang, Beijing (CN); Gang Xu, Beijing (CN); Geng Yun, Spring, TX (US); Wei Chen, Zhejiang (CN); Yuelin Shen, Spring, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 418 days.

(21) Appl. No.: 14/717,531

(22) Filed: May 20, 2015

(65) Prior Publication Data

US 2015/0337640 A1    Nov. 26, 2015

Related U.S. Application Data

(60) Provisional application No. 62/001,437, filed on May 21, 2014.

(51) Int. Cl.
| | |
|---|---|
| G06G 7/48 | (2006.01) |
| E21B 44/00 | (2006.01) |
| G06F 17/50 | (2006.01) |
| E21B 7/20 | (2006.01) |

(52) U.S. Cl.
CPC ............... *E21B 44/00* (2013.01); *E21B 7/20* (2013.01); *G06F 17/5009* (2013.01)

(58) Field of Classification Search
CPC combination set(s) only.
See application file for complete search history.

(56) References Cited

U.S. PATENT DOCUMENTS

| | | | |
|---|---|---|---|
| 6,516,293 B1 | 2/2003 | Huang et al. | |
| 6,785,641 B1 | 8/2004 | Huang | |
| 6,873,947 B1 | 3/2005 | Huang et al. | |
| 7,020,597 B2 | 3/2006 | Oliver et al. | |
| 7,139,689 B2 | 11/2006 | Huang | |
| 7,258,175 B2 * | 8/2007 | Veeningen | E21B 10/00 175/39 |
| 7,464,013 B2 | 12/2008 | Huang et al. | |

(Continued)

FOREIGN PATENT DOCUMENTS

WO     2005/091888 A2    10/2005

OTHER PUBLICATIONS

Mohammed Fayez Al Dushaishi Investigation of Drillstring Vibration Reduction Tools Missouri University of Science and Technology (Year: 2012).*

(Continued)

*Primary Examiner* — Aniss Chad
*Assistant Examiner* — Cuong V Luu

(57) ABSTRACT

A method for selecting a bottomhole assembly (BHA) includes inputting casing while drilling BHA parameters, wellbore parameters, and casing while drilling operating parameters, performing a dynamic simulation of a first BHA based on the casing while drilling BHA parameters, wellbore parameters, and casing while drilling operating parameters, and presenting a first set of performance data of the first BHA calculated from the dynamic simulation.

17 Claims, 24 Drawing Sheets

(56) References Cited

U.S. PATENT DOCUMENTS

| | | | |
|---|---|---|---|
| 7,693,695 B2 | 4/2010 | Huang et al. | |
| 7,844,426 B2 | 11/2010 | Huang | |
| 7,953,586 B2 | 5/2011 | Chen et al. | |
| 8,401,831 B2 | 3/2013 | Tang et al. | |
| 8,589,136 B2* | 11/2013 | Ertas | E21B 7/00 166/369 |
| 2002/0103630 A1* | 8/2002 | Aldred | E21B 44/00 703/10 |
| 2004/0143427 A1 | 7/2004 | Huang et al. | |
| 2004/0211596 A1* | 10/2004 | Huang | E21B 10/00 175/38 |
| 2005/0060096 A1* | 3/2005 | Hutchinson | E21B 44/00 702/6 |
| 2005/0096847 A1 | 5/2005 | Huang | |
| 2006/0162962 A1* | 7/2006 | Koederitz | E21B 45/00 175/27 |
| 2006/0167668 A1* | 7/2006 | Cariveau | E21B 10/00 703/7 |
| 2006/0254819 A1* | 11/2006 | Moriarty | E21B 7/068 175/40 |
| 2007/0067147 A1 | 3/2007 | Huang | |
| 2009/0055135 A1* | 2/2009 | Tang | E21B 10/00 703/1 |
| 2010/0082256 A1* | 4/2010 | Mauldin | E21B 12/02 702/9 |
| 2011/0147083 A1* | 6/2011 | Mauldin | E21B 44/00 175/50 |
| 2011/0172976 A1* | 7/2011 | Budiman | E21B 47/022 703/2 |
| 2011/0214878 A1 | 9/2011 | Bailey et al. | |
| 2011/0280104 A1* | 11/2011 | McClung, III | E21B 3/02 367/82 |
| 2012/0016589 A1* | 1/2012 | Li | E21B 47/0006 702/9 |
| 2012/0130693 A1* | 5/2012 | Ertas | E21B 44/00 703/2 |
| 2012/0255788 A1* | 10/2012 | Schwefe | E21B 10/62 175/61 |
| 2012/0316787 A1* | 12/2012 | Moran | E21B 44/00 702/9 |
| 2013/0049981 A1* | 2/2013 | MacPherson | E21B 44/00 340/853.1 |
| 2014/0172303 A1* | 6/2014 | Ibrahim | E21B 47/00 702/6 |
| 2014/0309978 A1* | 10/2014 | Chen | E21B 41/00 703/7 |
| 2015/0176344 A1* | 6/2015 | McLoughlin | E21B 17/1078 175/24 |
| 2015/0176401 A1* | 6/2015 | Samuel | E21B 44/00 702/6 |
| 2015/0233231 A1* | 8/2015 | Rodney | E21B 47/0006 73/152.58 |

OTHER PUBLICATIONS

TESCO Corporation, Casing Drilling Engineering, Sep. 2010, 133 pages.

International Search Report and Written Opinion issued in corresponding international application No. PCT/US2015/031914, dated Aug. 6, 2015 (18 pages).

\* cited by examiner

# METHODS FOR ANALYZING AND OPTIMIZING CASING WHILE DRILLING ASSEMBLIES

CROSS-REFERENCE TO RELATED APPLICATIONS

This application claims priority to Application No. 62/001,437, filed on May 21, 2014, which is incorporated by reference in its entirety.

BACKGROUND

Operations, such as geophysical surveying, drilling, drilling, logging, well completion, hydraulic fracturing, steam injection, and production, are typically performed to locate and gather valuable subterranean assets, such as valuable fluids or minerals. The subterranean assets are not limited to hydrocarbons such as oil or gas. After gathering valuable subterranean assets, operations such as well abandonment may involve the sealing of a well to safely and economically decommission a well.

Throughout this document, the terms "oilfield" and "oilfield operation" may be used interchangeably with the terms "field" and "field operation" to refer to a site where any types of valuable fluids or minerals can be found and the activities involved to extract them. The terms may also refer to sites where substances are deposited or stored by injecting them into subterranean structures using boreholes and the operations associated with this process. Further, the term "field operation" refers to a field operation associated with a field, including activities related to field planning, wellbore drilling, wellbore completion, production using the wellbore (also referred to as borehole), and abandonment of a well after production has completed (well sealing).

SUMMARY

In general, in one aspect, one or more embodiments of the present disclosure relate to a system for selecting a bottomhole assembly (BHA) including a computing device having a computing processor executing instructions to perform: executing a first simulation to generate a first set of performance data, and executing a second simulation to generate a second set of performance data. The computing device including a graphical user interface executing on the computer processor with functionality to perform: inputting a plurality of casing while drilling BHA parameters, wellbore parameters, and drilling operating parameters, presenting, on the graphical user interface, the first set of performance data from the first simulation, the first simulation based on the plurality of casing while drilling BHA parameters, wellbore parameters, and casing while drilling operating parameters, modifying, based on the first set of performance data, at least one of the plurality of casing while drilling BHA parameters, the plurality of wellbore parameters, and the plurality of casing while drilling parameters, in which modifying involves changing a value of the at least one parameter to obtain a modified parameter, presenting, on the graphical user interface, the second set of performance data from the second simulation, the second simulation based on the modified parameter, and selecting a BHA based on the first and second sets of performance data.

In general, in another aspect, one or more embodiments of the present disclosure relate to a method for selection a bottomhole assembly (BHA) including inputting casing while drilling BHA parameters, wellbore parameters, and drilling operating parameters, performing a parameter sensitivity study based on the casing while drilling BHA parameters, wellbore parameters, and drilling operating parameters, and presenting a first set of sensitivity data based on the parameter sensitivity study.

In general, in another aspect, one or more embodiments of the present disclosure relate to a method for selecting a bottomhole assembly (BHA) includes inputting casing while drilling BHA parameters, wellbore parameters, and casing while drilling operating parameters, performing a dynamic simulation of a first BHA based on the casing while drilling BHA parameters, wellbore parameters, and casing while drilling operating parameters, and presenting a first set of performance data of the first BHA calculated from the dynamic simulation.

In general, in yet another aspect, one or more embodiments of the present disclosure relate to a method of designing a bottomhole assembly (BHA) including obtaining a plurality of field data, inputting a plurality of casing while drilling BHA parameters, wellbore parameters, and casing while drilling operating parameters corresponding to a field environment, performing a dynamic simulation of a first BHA based on the a plurality of casing while drilling BHA parameters, wellbore parameters, and casing while drilling operating parameters, presenting a first set of performance data calculated from the dynamic simulation of the first BHA, and comparing the first set of performance data to the plurality of field data.

In general, in one aspect, one or more embodiments of the present disclosure relate to a non-transitory computer readable medium including executable instructions selecting a BHA, the executable instructions having functionality to: input, using a graphical user interface, casing while drilling BHA parameters, wellbore parameters, and casing while drilling operating parameters, perform a dynamic simulation of a first BHA based on the casing while drilling BHA parameters, wellbore parameters, and casing while drilling operating parameters, and present, on the graphical user interface, a first set of performance data of the first BHA calculated from the dynamic simulation.

In general, in another aspect, one or more embodiments of the present disclosure relate to a non-transitory computer readable medium including executable instructions for selecting a BHA, the executable instructions having functionality to: input, using a graphical user interface, casing while drilling BHA parameters, wellbore parameters, and casing while drilling operating parameters, perform a dynamic simulation of a first BHA based on the BHA parameters, wellbore parameters, and drilling operating parameters, present, on the graphical user interface, a first set of performance data of the first BHA calculated from the dynamic simulation, modify, using the graphical user interface, at least one of BHA parameters, wellbore parameters, and drilling operating parameters, perform a dynamic simulation of a second BHA based on the at least one parameter, and present, on the graphical user interface, a second set of performance data of the second BHA calculated from the dynamic simulation.

In general, in one aspect, one or more embodiments of the present disclosure relate to a non-transitory computer readable medium including executable instructions designing a bottomhole assembly (BHA), the executable instructions having functionality to: input, using a graphical user interface, BHA parameters, wellbore parameters, and drilling operating parameters, perform a dynamic simulation of a first BHA based on the BHA parameters, wellbore parameters, and drilling operating parameters, present, on the graphical user interface, a first set of performance data of the first BHA calculated from the dynamic simulation, and modify, using the graphical user interface, at least one parameter selected from the group consisting of BHA parameters, wellbore parameters, and drilling operating parameters to obtain a modified BHA.

This summary is provided to introduce a selection of concepts that are further described below in the detailed description. This summary is not intended to identify key or essential features of the claimed subject matter, nor is it intended to be used as an aid in limiting the scope of the claimed subject matter.

Other aspects and advantages of the disclosure will be apparent from the following description and the appended claims.

DETAILED DESCRIPTION

Figure 1:
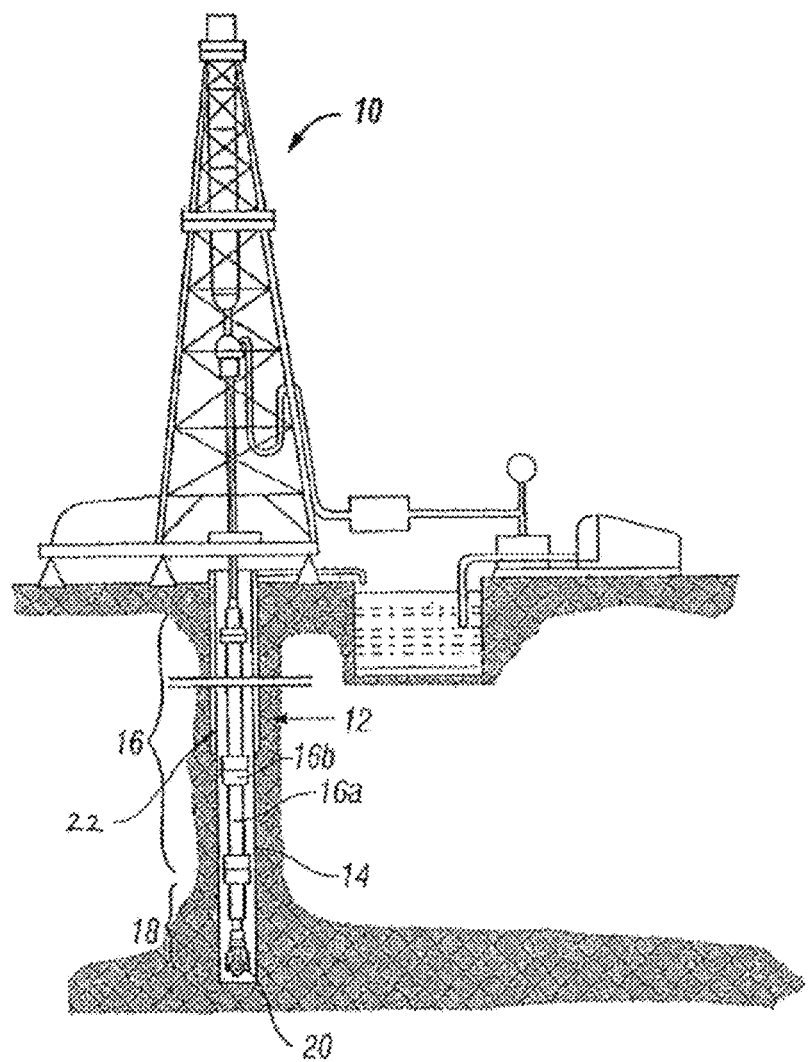
FIG. 1 shows a conventional drilling system for drilling an earth formation.

Embodiments are shown in the above-identified drawings and described below. In describing the embodiments, like or identical reference numerals are used to identify common or similar elements. The drawings are not necessarily to scale and certain features may be shown exaggerated in scale or in schematic in the interest of clarity and conciseness.

While most of the terms used herein will be recognizable to those of skill in the art, it should be understood, however, that when not explicitly defined, terms should be interpreted as adopting a meaning presently accepted by those skilled in the art.

FIG. 1 shows one example of a conventional drilling system for drilling an earth formation. The drilling system includes a drilling rig 10 used to turn a drilling tool assembly 12 that extends downward into a wellbore 14. The drilling tool assembly 12 includes a drill string 16, and a bottomhole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases, the drill string 16 further includes additional components such as subs, pup joints, etc.

The BHA 18 includes at least a bit 20. BHAs may also include additional components attached between the drill string 16 and the bit 20. Examples of additional BHA components include drill collars, stabilizers ("stabs"), measurement-while-drilling (MWD) tools, logging-while-drilling (LWD) tools, subs, hole enlargement devices (e.g., hole openers and reamers), jars, accelerators, thrusters, downhole motors, and rotary steerable systems.

When drilling, sufficient rotational moment and axial force should be applied to the bit 20 to cause the cutting elements of the bit 20 to cut into material and/or crush formation as the bit 20 is rotated. The axial force applied on the bit 20 is referred to as the "weight on bit" (WOB). The rotational moment applied to the drilling tool assembly 12 at the drill rig 10 (often by a rotary table or a top drive mechanism) to turn the drilling tool assembly 12 is referred to as the "rotary torque." Additionally, the speed at which the rotary table rotates the drilling tool assembly 12, measured in revolutions per minute (RPM), is referred to as the "rotary speed."

Figure 2:
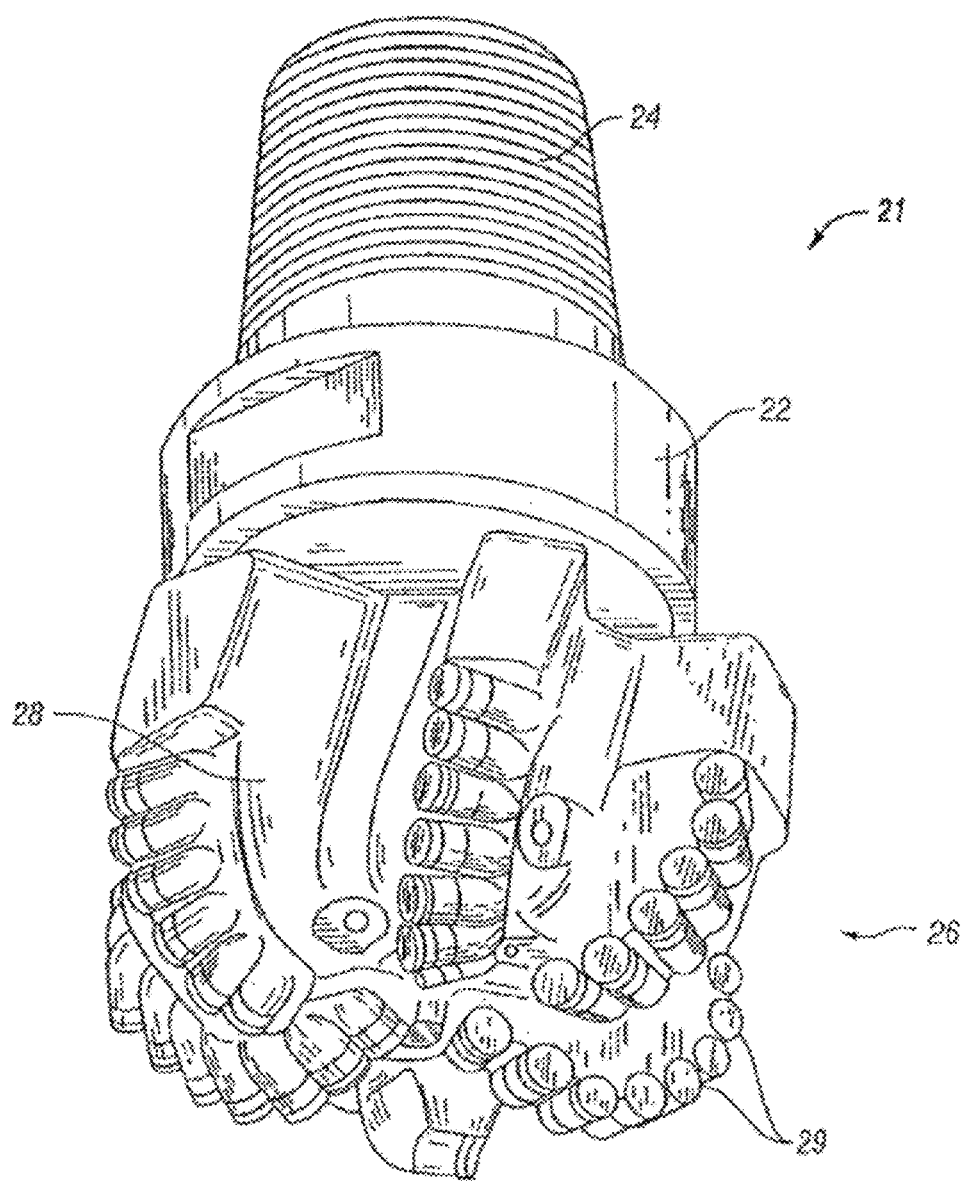
FIG. 2 shows a conventional fixed-cutter bit.

Drilling typically refers to using a drill bit (e.g., bit 20, FIG. 1) to remove earth formation at a distal end of a borehole. Referring to FIG. 2, an example of a drill bit known as a fixed-cutter bit is shown. Fixed-cutter bit 21 has a bit body 22 having a threaded connection at one end 24 and a cutting head 26 formed at the other end. The head 26 of the fixed-cutter bit 21 includes a plurality of blades 28 arranged about the rotational axis of the drill bit and extending radially outward from the bit body 22. Cutting elements 29 are embedded in the blades 28 to cut formation as the drill bit is rotated on a bottom surface of a well bore. Cutting elements 29 of fixed-cutter bits include polycrystalline diamond compacts (PDC) or specially manufactured diamond cutters. These drill bits are also referred to as PDC bits or drag bits.

During drilling, it may be desired to change the trajectory of a borehole. For example, it may be desired to change the trajectory of a substantially vertically drilled borehole to a substantially horizontally drilled borehole (or vice versa). The transition from vertical drilling to horizontal drilling (or vice versa) is known as directional drilling. Directional drilling involves certain terms of art, which are presented below for background information.

The method used to obtain the measurements to calculate and plot a 3D well path is called a directional survey. Three parameters are measured at multiple locations along the well path-measure depth (MD), inclination, and hole direction. MD is the actual depth of the hole drilled to any point along the wellbore or the total depth as measured from the surface location. Inclination is the angle, measured in degrees, by which the wellbore or survey-instrument axis varies from a true vertical line. An inclination of 0° would be true vertical, and an inclination of 90° would be horizontal.

Hole direction is the angle, measured in degrees, of the horizontal component of the borehole or survey-instrument axis from a known north reference. This reference is true north, magnetic north, or grid north, and is measured clockwise by convention. Hole direction is measured in degrees and is expressed in either azimuth (0 to 360°) or quadrant (Northeast (NE), Southeast (SE), Southwest (SW), Northwest (NW)) form.

The "build rate" is the positive change in inclination over a normalized length (e.g., 3°/100 ft.). A negative change in inclination would be the "drop rate."

A long-radius horizontal well is characterized by build rates of 2 to 6°/100 ft, which result in a radius of 3,000 to 1,000 ft, respectively. This profile is typically drilled with conventional directional-drilling tools, and lateral sections of up to 8,000 ft have been drilled.

Medium-radius horizontal wells have build rates of 6 to 35°/100 ft, radii of 1,000 to 160 ft, respectively, and lateral sections of up to 8,000 ft. These wells are drilled with specialized downhole mud motors and conventional drill-string components. Double-bend assemblies are designed to build angles at rates up to 35°/100 ft. The lateral section is often drilled with conventional steerable motor assemblies.

Short-radius horizontal wells have build rates of 5 to 10°/3 ft (1.5 to 3°/ft), which equates to radii of 40 to 20 ft, respectively. The length of the lateral section varies between 200 and 900 ft. Short-radius wells are drilled with specialized drilling tools and techniques. This profile is most commonly drilled as a re-entry from any existing well.

Once a wellbore has been drilled, or while a wellbore is being drilled, it may be advantageous to line, or "case," the wellbore to protect the borehole from the collapse of the earth formation wall into the wellbore, to provide strength for the installation of equipment, and/or to prevent fluids from leaking into the surrounding formation, among a variety of other reasons. Prior to casing, the borehole or a section of the borehole is referred to as openhole.

The liner used in casing the borehole is referred to as "casing" and typically includes large-diameter pipe that is lowered into the borehole and cemented into place. The cement may surround the entirety or a portion of the casing. The casing (as shown in FIG. 1, element 22) may be formed from a high strength material such as stainless steel, aluminum, titanium, fiberglass, and/or other materials. Further, the casing may include a number of couplings and/or collars that connect a number of pipes to one another. This series of connected casings is known as a casing string.

Typically, a borehole is drilled using a drill bit disposed at a distal end of a drill string. If the borehole is to be cased, after a particular amount of time, or when the drill bit reaches a specific depth, the drill string is pulled out of the hole so that casing may be placed therein. This specific depth or location at which the drill string is pulled out is known as the casing point. The casing point, in some scenarios, is a pre-determined depth or location, however, the casing point may be determined during drilling or selected on site based on geological observations, well site conditions, and/or anticipated problems, for example.

In addition, the casing point may be determined based on the diameter of casing to be used over a given interval of the borehole. For example, the location at which drilling a certain diameter borehole ends (e.g., when a new diameter is desirable) may be a casing point. In general, any region of the borehole in which it is determined to be protected by casing, for example, weak zones along the borehole, below normal pressure zones, or areas that show signs of hydrocarbon production, may be desirable casing points. Those having ordinary would know that the casing point may be changed at any time.

Pulling the drill string out of the hole and replacing it therein is often referred to as tripping and may happen for a number of reasons, such as, for example, if a bit has dulled or if a component of the drill string is not operating efficiently or properly and/or should be replaced. Further, as mentioned above, if the borehole is to be cased, the drill string is pulled out so that casing may then be run into the borehole. After the casing has been run, the drill string may be placed back into the borehole so that drilling may continue.

However, the process of tripping the drill string and casing the borehole often involves substantial time and expense. Furthermore, the processes of tripping and casing also expose personnel and equipment to additional risks that may be more commonly associated with the processes. Thus, it may be advantageous to integrate (or combine) the drilling process with the casing process in order to provide a more efficient operation and system capable of eliminating some or all drill string trips. The integration of these two processes may be referred to as "casing while drilling" or "casing drilling". When drilling intervals where the casing does not have to be run to the surface, the process may be referred to as "liner while drilling" or "liner drilling", which, for the purposes of the present disclosure may be considered a subset or type of casing drilling and thus fall within the scope of the concept of casing drilling, as that term may be used herein.

In order for casing while drilling to be feasible and efficient, specific drilling and operating equipment may be desirable. The specific drilling and operating equipment may include traditional drilling and operating equipment that has been modified to be capable of operating in a casing while drilling operation or the equipment may be designed and engineered specifically for use in a casing while drilling operation. For example, casing used to line a borehole during a traditional drilling operation may not be designed to withstand the torque that is applied to rotate the casing along an axis parallel to its length during a casing while drilling operation. Therefore, in order for a casing while drilling operation to be successful, the particular casing used in the operation may be designed to withstand the torque involved to rotate the casing. As such, research and further development may also be involved to design such a casing.

In other scenarios, a given BHA may not be easily attachable to a casing string or a particular casing string may not be capable of having a BHA attached to a distal end thereto. Therefore, one or more components and/or adaptors may be designed in order to attach a given BHA to a particular casing string. In other embodiments, a new BHA and/or a new casing string may be designed to allow for the attachment of the BHA to the casing string. Accordingly, and similar to the above, research and further development may be performed to design such components and/or adaptors.

As such, substantial expense is involved in the design and manufacture of drilling and operating equipment (e.g., BHAs, casing). Therefore, in order to optimize performance, engineers may consider a variety of factors. For example, when selecting and/or designing a BHA, engineers may consider a rock profile (e.g., the type of rock or the geologic characteristics of an earth formation), different forces acting on the BHA, drilling performance parameters, drill bit parameters, and/or well bore parameters, among many others. However, without accurate models or simulations of BHAs and how they operate in a given condition, engineers may not be provided with enough quantitative and substantial information to make an optimal or desired BHA choice. Therefore, comparison of different drill bits along with comparison of different drill bit parameters, wellbore parameters, and drilling operating parameters, may be helpful in determining the optimal BHA to be used during the casing while drilling technique.

Accordingly, embodiments disclosed herein provide methods and techniques to model the behavior of various BHA packages under multiple conditions to achieve an optimal BHA package for a given casing drilling operation. More particularly, one or more embodiments disclosed herein provide for methods of directly comparing various BHA packages (against selected criteria or against each other) to determine which package may be the desired one. In other embodiments, a BHA designer can make recommendations on structures to use in a BHA package, in order to satisfy one or more criteria. For sake of clarity, a number of definitions are provided below.

"Well bore parameters" may include one or more of the following: the geometry of a well bore and formation material properties (i.e. geologic characteristics). The trajectory of a well bore in which the drilling tool assembly is to be confined also is defined along with an initial well bore bottom surface geometry. Because the well bore trajectory may be straight, curved, or a combination of straight and curved sections, well bore trajectories, in general, may be defined by defining parameters for each segment of the trajectory. For example, a well bore may be defined as comprising N segments characterized by the length, diameter, inclination angle, and azimuth direction of each segment and an indication of the order of the segments (i.e., first, second, etc.).

Well bore parameters defined in this manner can then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore, casing and cement properties, and well bore fluid properties, among others, without departing from the scope of the disclosure.

"BHA parameters" may include one or more of the following: the type, location, and number of components included in the drilling tool assembly; the length, internal diameter of components, outer diameter of components, weight, and material properties of each component; the type, size, weight, configuration, and material properties of the drilling tool; and the type, size, number, location, orientation, and material properties of the cutting elements on the drilling tool. Material properties in designing a drilling tool assembly may include, for example, the strength, elasticity, and density of the material. It should be understood that drilling tool assembly design parameters may include any other configuration or material property of the drilling tool assembly without departing from the scope of the disclosure.

"Bit parameters," which are a subset of BHA parameters, may include one or more of the following: bit type, size of bit, shape of bit, cutting structures on the bit, such as cutting type, cutting element geometry, number of cutting structures, and location of cutting structures. As with other components in the drilling tool assembly, the material properties of the bit may be defined.

"Drilling operating parameters" or "Casing while drilling operating parameters" may include one or more of the following: the rotary table (or top drive mechanism), speed at which the drilling tool assembly is rotated (RPM), the downhole motor speed (if a downhole motor is included) and the hook load. Drilling operating parameters may further include drilling fluid parameters, such as the viscosity and density of the drilling fluid and pump pressure, for example. It should be understood that drilling operating parameters are not limited to these variables. In other embodiments, drilling operating parameters may include other variables, e.g., rotary torque and drilling fluid flow rate. Dip angle is the magnitude of the inclination of the formation from horizontal. Strike angle is the azimuth of the intersection of a plane with a horizontal surface. Additionally, drilling operating parameters for the purpose of drilling simulation may further include the total number of drill bit revolutions to be simulated, the total distance to be drilled, or the total drilling time desired for drilling simulation.

"Drilling performance" may be measured by one or more drilling performance parameters. Examples of drilling performance parameters include rate of penetration (ROP), rotary torque to turn the drilling tool assembly, rotary speed at which the drilling tool assembly is turned, drilling tool assembly lateral, axial, or torsional vibrations and accelerations induced during drilling, WOB, weight on reamer (WOR), forces acting on components of the drilling tool assembly, and forces acting on the drill bit and components of the drill bit (e.g., on blades and/or cutting elements). Drilling performance parameters may also include the torque along the drilling tool assembly, bending moment, alternative stress, percentage of fatigue life consumed, pump pressure, stick slip, dog leg severity, borehole diameter, deformation, work rate, azimuth and inclination of the well, build up rate, walk rate, and bit geometry. One skilled in the art will appreciate that other drilling performance parameters exist and may be considered without departing from the scope of the disclosure.

While drilling, the actual WOB and WOR are not constant. Some of the fluctuation in the force applied to the bit or reamer may be the result of the bit contacting with surfaces having harder and softer portions that break unevenly. However, in most cases, the majority of the fluctuation can be attributed to drilling tool assembly vibrations. Drilling tool assemblies can extend more than a mile in length while being less than a foot in diameter. As a result, these assemblies are relatively flexible along their length and may vibrate when driven rotationally by the rotary table. Drilling tool assembly vibrations may also result from vibration of the bit during drilling. Several modes of vibration are possible for drilling tool assemblies. In general, drilling tool assemblies may experience torsional, axial, and lateral vibrations. Although partial damping of vibration may result due to viscosity of drilling fluid, friction of the drill pipe rubbing against the wall of the well bore, friction of the casing rubbing against the wall of the well bore, energy absorbed in drilling, and drilling tool assembly impacting with borehole, these sources of damping are typically not enough to suppress vibrations completely.

The aforementioned problems may be increasingly substantial when dealing with directional wells. Successful drilling operations involve appropriate selection of drilling tools, fluids, and techniques. Drills, or similar cutting tools, should be appropriate for the borehole conditions and the materials to be removed. The fluids should be capable of removing drilled material from the wellbore. Additionally, the techniques employed should be appropriate for the anticipated conditions in order to achieve operation objectives.

Accordingly, in one aspect, the present disclosure provides a method of analyzing the performance of different BHAs to determine the possibility of bit failure, BHA failure, drillstring failure, and/or the failure of any other drilling components. Additionally, the present disclosure provides a method for analyzing the performance of different BHAs against pre-selected criteria, against one another, and/or against data acquired in the field.

As used herein, a "drilling simulation" is a dynamic simulation of a BHA used in a drilling operation. The drilling simulation is referred to as being "dynamic" because the drilling is a "transient time simulation," meaning that it is based on time or the incremental rotation of the drilling tool assembly. Methods for such simulations are known to the assignee of the current application, such as those disclosed in U.S. Pat. Nos. 6,516,293, 6,873,947, 7,844,426, 7,139,689, 6,785,641, 8,401,831, and 7,464,013 as well as U.S. patent application Ser. Nos. 10/749,019, 10/852,574, 10/851,677, 10/888,358, and 10/888,446, all of which are incorporated by reference in their entirety.

Figure 3:
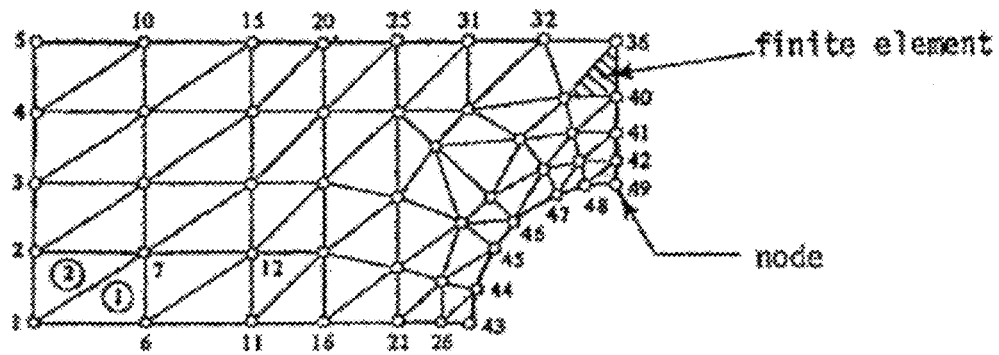
FIG. 3 shows a visualization of a finite element analysis in accordance with one or more embodiments of the present disclosure.

The drilling simulation may be performed using one or more of the methods set forth above. In one or more embodiments, the BHA is modeled with beam elements (using finite element analysis (FEA) techniques as known in the art). Briefly, FEA involves dividing a body under study into a finite number of pieces (subdomains) called elements. Such a division is shown in FIG. 3.

Particular assumptions are then made on the variation of the unknown dependent variable(s) across each element using so-called interpolation or approximation functions. This approximated variation is quantified in terms of solution values at special element locations called nodes.

Through this discretization process, the method sets up an algebraic system of equations for unknown nodal values which approximate the continuous solution. Because element size, shape and approximating scheme can be varied to suit the problem, the method can accurately simulate solutions to problems of complex geometry and loading.

Each beam element has two nodes. For a MWD/LWD tool, for example, the tool is divided into beam elements, based on the geometry of the tool and sensor locations. The nodes are located at the division points of the elements. During the simulation, the wellbore is drilled by the bit and propagates as the bit progresses. The BHA is confined in the wellbore. The BHA moves dynamically during the simulation, depending on the loading and contacting conditions as well as initial conditions.

When the BHA moves in the well bore, the nodes will have history of accelerations, velocity, and displacement, etc. The location of the nodes referencing to the well center or wellbore can be determined. Representative results that are produced by the simulation include accelerations at the bit, drill, stabs and other locations; velocities at the bit, drill, stabs and other locations; displacements at the bit, drill, stabs, and other locations; the trajectory of the bit, drill, stabs, and other locations; torque of the bit, drill, stabs, and other locations; and contact force of the bit, drill, stabs, and other locations. Any or all of these results may be produced in the form of time history, box and whisker plots, 2D or 3D animations, and/or pictures, among many others.

In one or more embodiments, the simulation provides visual outputs of performance parameters. Further, the outputs may include tabular data of one or more performance parameters. In addition, the outputs may be in the form of graphs, charts, and/or logs, of a performance parameter, with respect to time, or with respect to location along the BHA, for example. When the outputs are given based on location along the BHA, the outputs may be presented as an average value for each location as well as other percentages, such as 5%, 10%, 25%, 75%, 90%, and 95%. P5%, P95%, P50%, etc. are statistical representation of a variable. For example, given a history of axial acceleration, a statistical distribution of all the points is determined. P5% number means that 5% of the points are below this value, P95% number means 95% of the points are below this value.

Other plots may include presentation or visualization of the results at a minimum or maximum value, or any combination of those results. A graphical visualization of the drill bit, drill string, and/or the drilling tools (e.g., a hole opener) may also be output. The graphical visualization (e.g., 2-D, 3-D, or 4-D) may include a color scheme for the drill string and BHA to indicate performance parameters at locations along the length of the drill string and BHA.

For the purposes of calibrating the model and having a baseline for potential solutions, a drilling simulation using the drilling operating parameters, wellbore parameters, and the previously used drilling tool assembly may be performed.

Figure 4A:
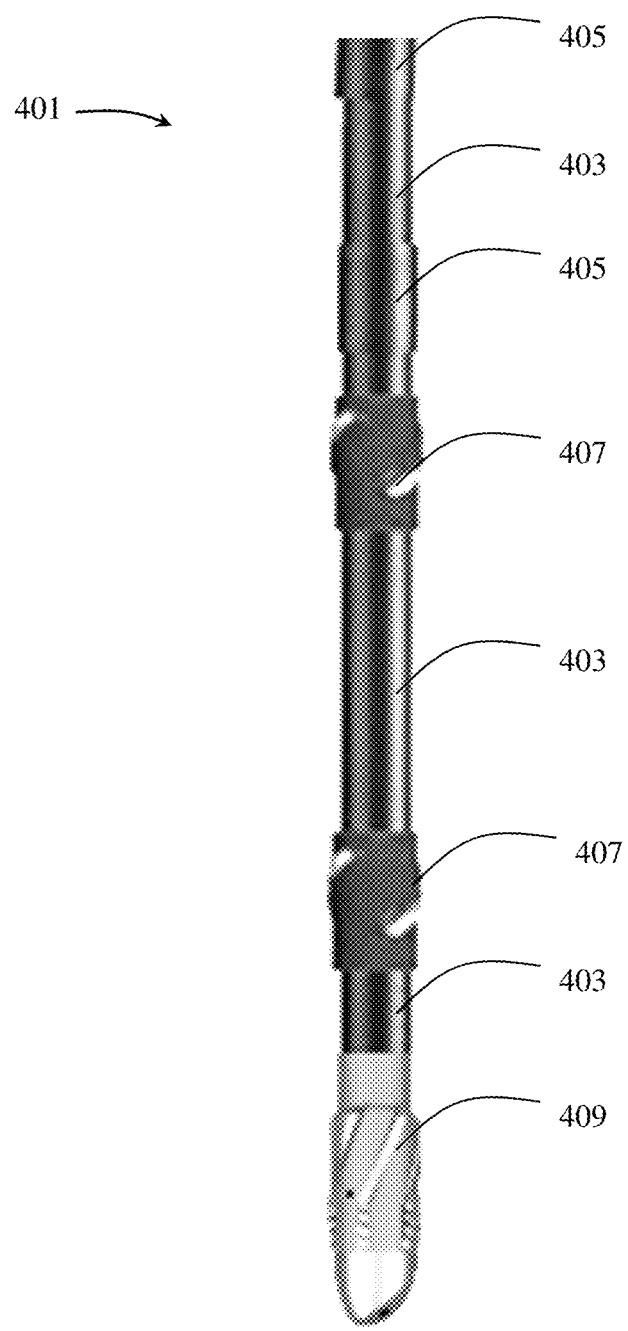
FIGS. 4A-4B show design examples of a casing drill string and a BHA, respectively, in accordance with one or more embodiments of the present disclosure.
Figure 4B:
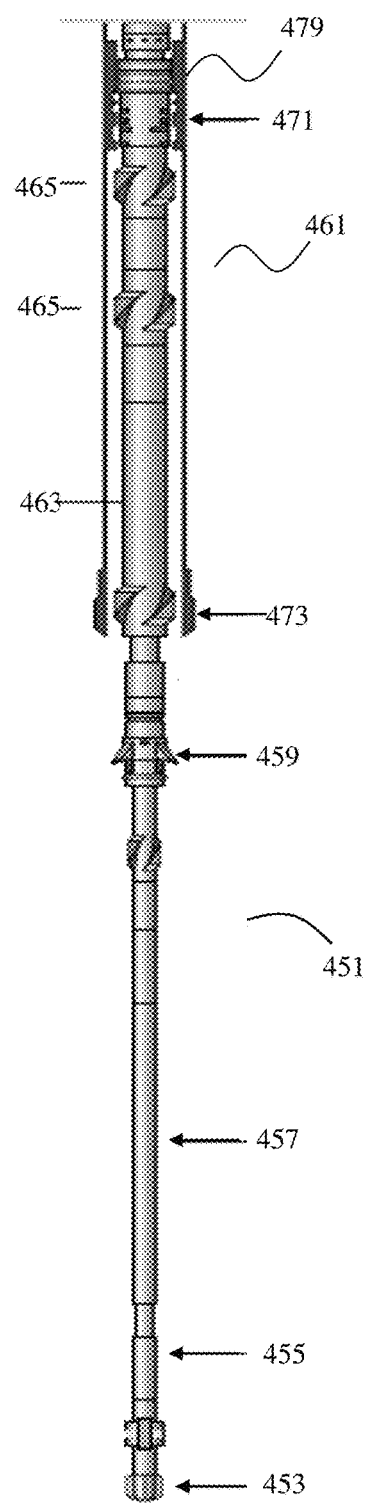

Referring to FIGS. 4A-4B, examples of drill strings in accordance with one or more embodiments of the present disclosure is shown. In one or more embodiments, one or more of the components shown in FIGS. 4A-4B may be omitted, repeated, and/or substituted. Accordingly, embodiments of the present disclosure should not be considered limited to the specific arrangements of elements shown in FIGS. 4A-4B.

As shown in FIG. 4A, a casing drilling string 401 includes casing joints 403 connected to each other using collars 405. The casing drilling string 401 also includes centralizers 407 which are used to stabilize the casing drilling string 401 during drilling. The centralizers 407 may be placed on each casing joint 403 or at pre-determined locations along the casing drilling string 401. The casing drilling string 401 may include a cutting tool, such as a reamer 409 disposed at a distal end of the casing drilling string 401. Reamers are commonly used to open or smooth out a borehole. As such, casing drilling string 401 may be used in pre-drilled holes (e.g., open holes) in order to smooth the walls of the borehole while casing the borehole. At the surface, a casing drilling system may be used to rotate the casing drilling string 401 to ream or smooth out a borehole. This combination of components may be referred to as a level one system. However, when the casing drilling string 401 is used to drill a borehole (e.g., forward or downward), a PDC bit (not shown) may be used as the cutting tool at the distal end of the casing drilling string 401. A PDC bit may be used for drilling vertical or tangential sections of a borehole (i.e., in situations when there is no desire for active directional control). In one or more embodiments, the PDC bit may be non-retrievable. Non-retrievable bits may be used until they have been dulled or until they no longer drill properly/efficiently. When this happens, the non-retrievable bit is disconnected from the BHA and left in the borehole. The bit may then be drilled through using another bit, for example, a mill bit, or it may remain in the borehole until borehole completion or borehole sealing. At the surface, a casing drilling system may be used to rotate the casing drilling string to drill a borehole. This type of system (with a non-retrievable BHA) may be referred to as level two casing drilling.

Other tools that maybe included on a casing drilling string an underreamer, a MWD tool, and a PDC bit. In some embodiments, these and other tools may be specifically designed to be retrieved. Such a casing drilling string may be capable of directional drilling in addition to both vertical and tangential drilling, and the underreamer, MWD tool, and PDC bit may be retrievable with assistance from a running/retrieval tool. The use of such a BHA that is designed to be retrieved and reset without pulling the casing out of the hole may be referred to as level three casing drilling.

It is also envisioned that in some embodiments, a liner drilling string may be used. In general, as mentioned above, a liner refers to a casing string that does not extend to the top of the borehole and is often anchored to or suspended from the inside of a previous casing string using a hanger, such as liner hanger. The liner drilling string may extend in a direction downhole and may have a drill bit or other tools disposed on a distal end. The liner may use slips for attaching to and detaching from a casing string. This system may be referred to as a level four casing drilling.

An example of a BHA in accordance with one or more embodiments of the present disclosure is shown in FIG. 4B. The example of the BHA 451 shown in FIG. 4B is capable of directional drilling. In one or more embodiments, BHA 451 includes a PDC bit 453 that is steerable using a rotary steerable system (RSS) 455. The RSS 455 is designed to drill directionally as opposed to merely drilling in a single axial direction. Axially above RSS 455 is a measurement-while-drilling (MWD) tool 457. In addition, BHA 451 may include an underreamer 459 designed to open or smooth the borehole during drilling such that casing string 461 may pass therethrough.

Further, the BHA 451 may include a mud motor 463 that uses hydraulic power of drilling fluid to drive the drill bit 453. Internal stabilizers 465 may be included and used to stabilize the BHA 451 when positioned within casing string 461. Internal stabilizers 465 may contact the ID of casing string 461 to limit the bending motion of the BHA within the casing string 461. A drilling lock assembly (DLA) 471 and its components (torque lock and axial lock) are used to lock the BHA 451 to the casing 461 such that when rotary torque is applied to casing string 461 by a casing drilling system (not shown) at the surface, the BHA 451 and casing string 461 rotate and displace axially together.

A casing string 461 may also include, close to the bit, a casing shoe 473, and a casing profile nipple (CPN) 479. This segment of casing string, having the casing shoe 473 and casing profile nipple 479, may be referred to as the lower casing. The casing string 461, and in particular the CPN 479, may be capable of locking/attaching to and unlocking/detaching from the BHA 451. For example, when an axial lock (not separately shown) and a torque lock (not separately shown) are engaged with the CPN 479, both axial and torsional movements applied to the casing string 461 cause the BHA 451 and the casing string 461 to move. Therefore, although the casing string 461 is indicated as a component in FIG. 4B, it may be separate from the BHA 451 such that one or more components (for example, mud motor 463, internal tandem stabilizers 465, and the DLA 471, as shown) of the BHA 451 are capable of being placed within and capable of locking to casing string 461. Further, it is also intended that one or more external centralizers (not shown) may be included on casing string 461.

Figure 4C:
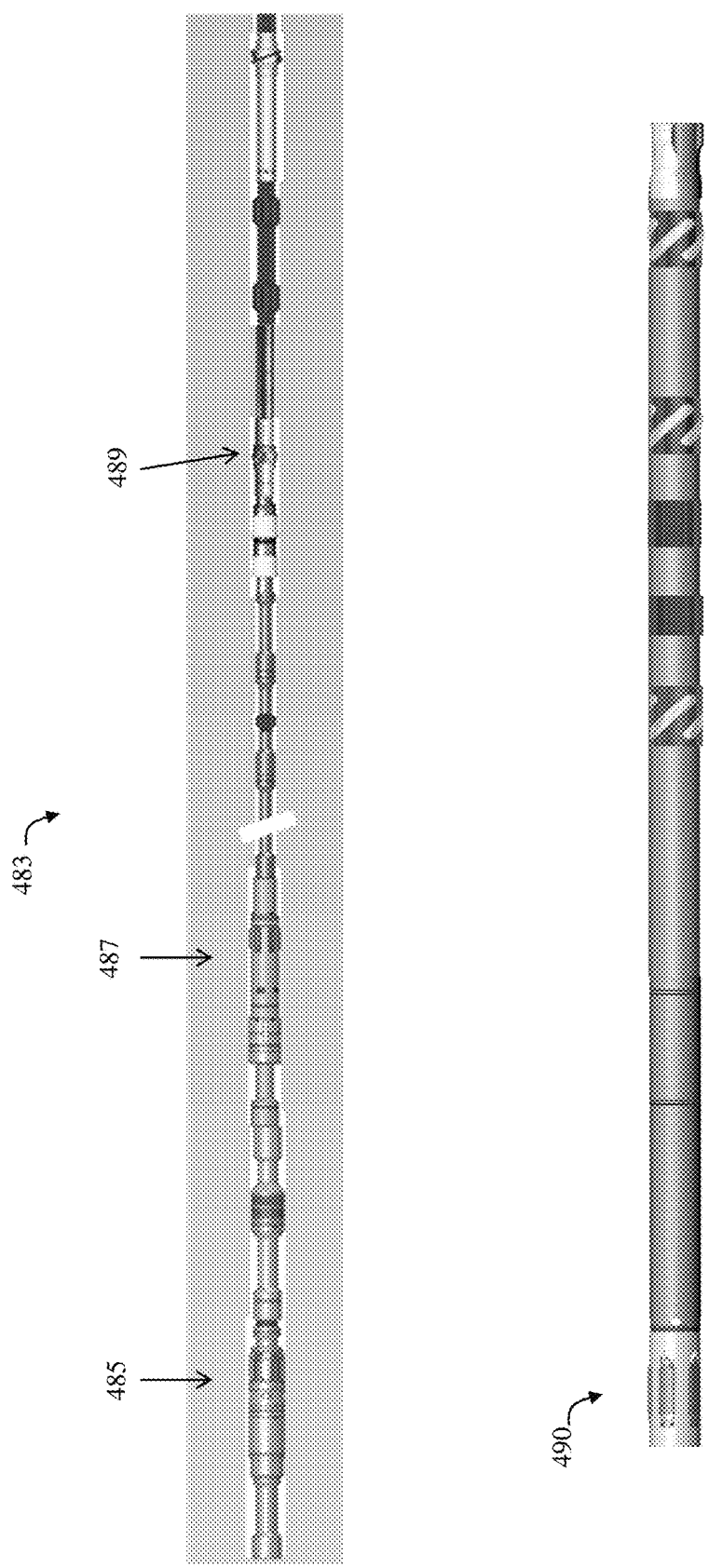
FIGS. 4C-4D shows design examples of liner drill strings in accordance with one or more embodiments of the present disclosure.
Figure 4D:
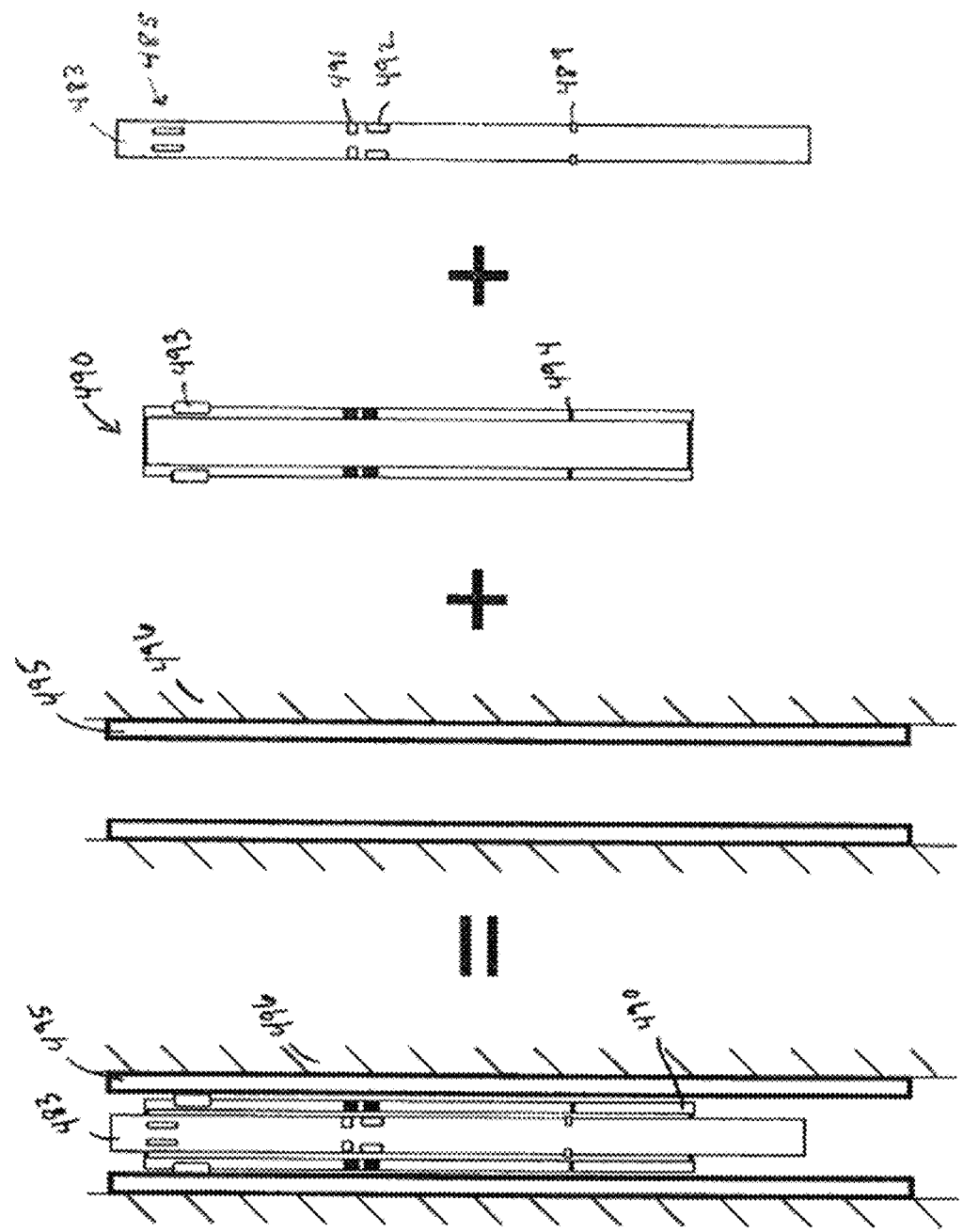

FIGS. 4C-4D depict examples of a liner drilling string. In FIG. 4C, liner drilling string 483 may be disposed within a liner 490. Accordingly, liner drilling string 483 may be referred to as an internal BHA and may include a liner hanger control tool (LHCT) 485, a liner drilling lock 487 and an indicator sub 489. The LHCT 485 controls when slips 493 (as shown in FIG. 4D) on liner hanger are engaged or disengaged. In FIG. 4D, liner drilling string 483 shows the LHCT 485, an axial lock 491, a torque lock 492, and indicator sub 489. In one or more embodiments, the drill string 483 is placed within the liner 490 and the liner 490 is placed within casing 495 of a borehole 496. When the indicator sub 489 of the liner drilling string 483 reaches the stop sub 494 of the liner 490, the axial lock 491 and torque lock 492 engage between the liner 490 and the liner drilling string 483. Then, during drilling, torque may be transferred to the liner drilling string 483 from surface and the slips 493 disengage with the casing 495 such that the liner 490 moves along with the liner drilling string 483. Further, additional components may be present on the liner drilling string, similar to as discussed above with respect to FIGS. 4A and 4B.

One of ordinary skill in the art would know and appreciate that the present disclosure is not limited to the example drilling strings and their illustrated components as shown in FIGS. 4A-4D. Rather, any tool components usable in casing and/or liner drilling may be used in embodiments of the present disclosure.

Figure 5A:
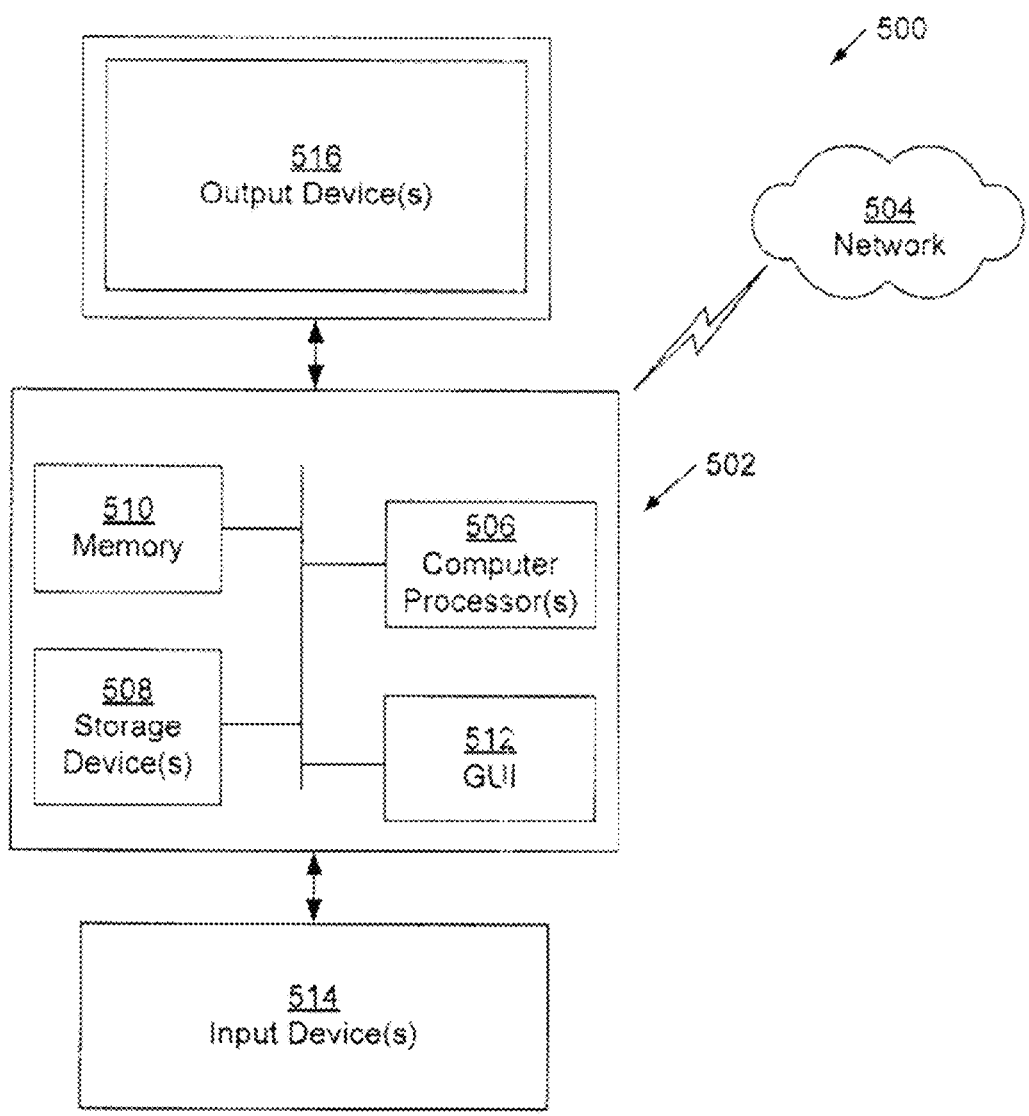
FIGS. 5A-5B show a system and a component segmentation in accordance with one or more embodiments of the present disclosure.

FIG. 5A depicts a system with which one or more embodiments of selecting a BHA or designing a BHA may be implemented. In one or more embodiments, one or more of the modules and elements shown in FIG. 5A may be omitted, repeated, and/or substituted. Accordingly, embodiments of selecting a BHA or designing a BHA should not be considered limited to the specific arrangements of modules shown in FIG. 5A.

In one or more embodiments, a BHA may be selected or designed. Referring to FIG. 5A, a system 500 includes a computing device 502 having one or more computing processors 506, one or more storage devices 508 (e.g., a hard disk, an optical drive such as a compact disk (CD) drive or digital versatile disk (DVD) drive, a flash memory stick, etc.), memory 510 (e.g., random access memory (RAM), cache memory, flash memory, etc.), and a graphical user interface (GUI) 512. The computing processor(s) 506 may be an integrated circuit for processing instructions. For example, the computing processor(s) may be one or more cores, or micro-cores of a processor. The storage device(s) 508 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 508 may be a device internal to the computing device 502. In another embodiment, the storage device(s) 508 may be an external storage device operatively connected to the computing device 502. Additionally, the computing device 502 may include numerous other elements and functionalities.

The computing device 502 may be communicatively coupled to a network 504 (e.g., a local area network (LAN), a wide area network (WAN) such as the Internet, mobile network, or any other type of network) through wires, cables, fibers, optical connectors, a wireless connection, or a network interface connection (not shown).

The system 500 may also include one or more input device(s) 514, such as a touchscreen, keyboard, mouse, microphone, touchpad, electronic pen, or any other type of input device. Further, the system 500 may include one or more output device(s) 516, such as a screen (e.g., a liquid crystal display (LCD), a plasma display, touchscreen, cathode ray tube (CRT) monitor, projector, 2D display, 3D display, or other display device), a printer, external storage, or any other output device. One or more of the output device(s) 516 may be the same or different from the input device(s). The input and output device(s) may be locally or remotely (e.g., via the network 504) connected to the computer processor(s) (506), memory (510), storage device(s)

(508), and GUI 512. Many different types of systems exist, and the aforementioned input and output device(s) may take other forms.

Further, one or more elements of the aforementioned system 500 may be located at a remote location and connected to the other elements over a network 504. Further, embodiments of the disclosure may be implemented on a distributed system having a plurality of nodes, where each portion of the disclosure may be located on a different node within the distributed system. In one embodiment of the disclosure, the node corresponds to a distinct computing device. In another embodiment, the node may correspond to a computer processor with associated physical memory. The node may also correspond to a computer processor or micro-core of a computer processor with shared memory and/or resources.

The GUI 512 may operated by a user (e.g., an engineer, a designer, an operator, an employee, or any other party) using one or more input devices 514 and the GUI 512 may be visualized one or more output devices 516 coupled to the computing device 502. The GUI may include one or more buttons (e.g., radio buttons), data fields (e.g., input fields), banners, menus (e.g., user input menus), boxes (e.g., input or output text boxes), tables (e.g., data summary tables), sections (e.g., informational sections or sections capable of minimizing/maximizing), screens (e.g., welcome screen or home screen), and/or user selection menus (e.g., drop down menus). In addition, the GUI may include one or more separate interfaces and may be usable in a web browser or as a standalone application.

Although the output device(s) 516 is shown as being communicatively coupled to the computing device 502, the output device(s) 516 may also be a component of the computing device 502.

In FIG. 5A, the computing device 502 is capable of simulating a BHA. The BHA to be simulated may be selected, by a user, from a pre-existing library of BHAs (not shown). For example, a company may generate and maintain a log, journal, and/or record of BHAs that have been used or designed in the past and any of these BHAs, among others, may be stored in the pre-existing library of BHAs. Further, the pre-existing library of drill bits may be stored on storage device(s) 508. Selecting a BHA from the pre-existing library of BHAs may be done by the user using the GUI 512, executed by the computing processor(s) 506, and may be visualized on one or more output devices 516.

In addition, or in another embodiment, a BHA may be customized, by the user, using the GUI 512 of the computing device 502. The user may customize the BHA by inputting or selecting a variety of drilling components (e.g., type of drill, number of cutters, material properties of the drill, or any other BHA or bit parameter known in the art or disclosed herein).

Additionally, the simulation may be customized by inputting or selecting a variety of well bore parameters and drilling operating parameters. To modify the BHA and/or customize the BHA or simulation, the user may access storage devices(s) 508 using any input means known in the art (e.g., input device(s) 514). The storage device(s) 508 is capable of having data stored thereon and may include, for example, rock profiles, BHA parameters and components, and/or drilling operating parameter, among many others. Once the user customizes the BHA and other simulation parameters, the computing device 502 may execute instructions on the computing processor(s) 506 to perform a simulation based on the customized BHA and the parameters selected or input by the user.

In addition, the BHA may be selected for simulation or modified based on data input or selected by the user. Based on the data, the computing device 502 may present to the user a number of BHAs (and BHA components) from the pre-existing library of BHAs for selection. The user may select one or more BHA components to be included in the simulation. Based on the selected BHA, a number of BHA parameters may also be presented to the user via the GUI 512. In other embodiments, the user may also modify a BHA based on particular drilling operating parameters, wellbore parameters, or any other conditions known in the art or disclosed herein. For example, a user may determine a desired WOB or ROP and may modify the BHA accordingly taking into account the desired WOB and/or ROP, among others using the GUI.

According to embodiments of the present disclosure, an engineer or BHA designer may input series of information about the BHA and various selected components of the BHA and drill string. The GUI 512 may be accessible via a network (e.g., Internet or Intranet), or may be standalone for use with any computing device known in the art (such as computing device 502, as shown in FIG. 5A). The GUI 512 may include a BHA view showing a BHA (similar to the schematics shown in FIGS. 4A-4D) that is currently being designed. The GUI 512 may also include a component view showing greater details of a selected component of the BHA, including details of the subcomponents that make up a given component. As discussed above, the selected component may be any downhole component known in the art. Also, the GUI 512 may include a tree view of the BHA and each of its components and sub-components. The GUI 512 may also include a number of buttons may be used to add/modify/delete a component or sub-component of the BHA. Additionally, a component of the BHA may be selected and modified using a property panel. The property panel may include user input boxes, menus, buttons, etc. that are accessible by the user and provide the user with editable features, dimensions, and/or properties of the selected component, such as ID, OD, length, weight, eccentricity, material properties, etc. (which may vary depending on the component selected. Using the property panel, the user may modify values of the selected component and its sub-components, and component buttons may add/modify/remove specific features of the selected component of the BHA. Further, a list of components may be shown on a BHA data list and messages may be viewed in a message box.

Figure 5B:
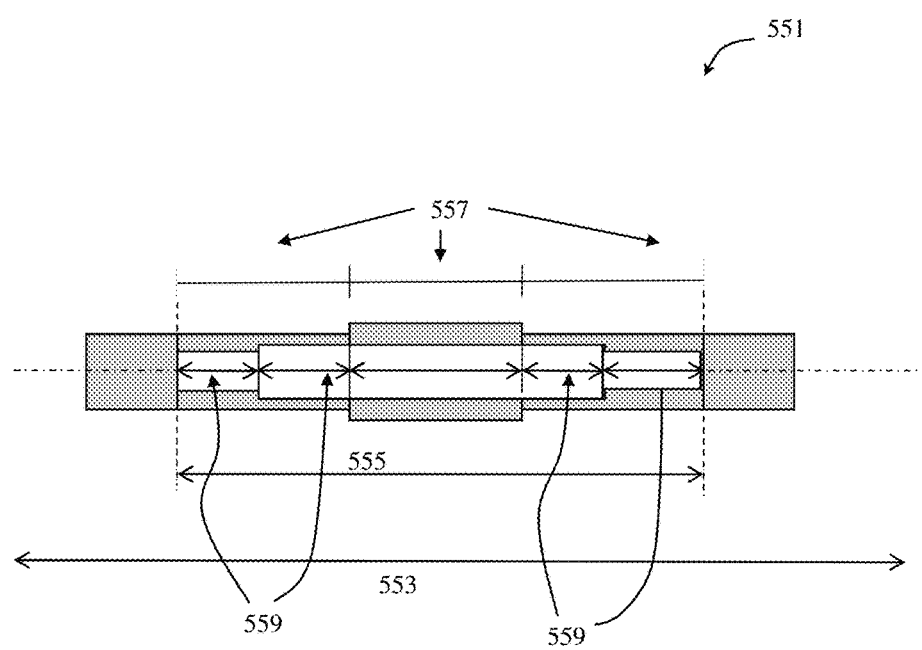

Referring now to FIG. 5B, a portion of BHA 551 is shown in accordance with one or more embodiments of the present disclosure. In one or more embodiments, the BHA is modeled with beam elements (using finite element analysis (FEA) techniques as known in the art), as discussed above (FIG. 3). A BHA 551 may be divided into components, each of which has a total length. Each component, for example, component 553, may be divided into sub-components, such as sub-component 555, as shown. Further, each sub-component may be divided into segments, such as segments 557, and the segments 557 may be divided into sub-segments 559. Lastly, each of these sub-segments 559 may be divided into elements (not shown) which are the fundamental units used in FEA analysis. Each of these have particular properties, dimensions, etc. that may be accommodated in the simulation and may not be limited to the above. For example, one sub-segment can be just one element, one segment may have a single sub-segment, and the lengths of particular segments could be zero indicating that there is no sub-segment to simulate, among many scenarios. An example of such component/sub-component/segment/sub-segment may include a length of the BHA (as the component) that includes a stabilizer (as the sub-component). The stabilizer includes segments of a fish neck, blades, and tong end. The fish neck and tong end may be further divided into multiple sub-segment lengths. Each of the segments and/or sub-segments may have different lengths, ID, OD, material properties that may be considered by the methods of the present disclosure. While a stabilizer has been used as an example, one skilled in the art, having read the present disclosure, would understand how such concept may be applied to other downhole components used in casing drilling.

Referring back to FIG. 5A, once the user customizes the BHA and other simulation parameters, the computing device 502 may execute instructions on the computing processor(s) 506 to perform a simulation based on the customized BHA and the parameters selected or input by the user. The drilling simulation may be performed using one or more of the methods set forth above. Executing the simulation generates a set of performance data. In some cases, the set of performance data generated may depend on the data selected or input by the user and may include instructions to generate specific performance data, such as, but not limited to, surface torque, WOB, WOR, bit RPM, cutter forces, build up rate, dog leg severity, bending moment, walk rate, and/or contact forces. Additionally, the performance data may include bit geometry, ROP, alternative stress, percentage of fatigue life consumed, stick slip, borehole diameter, deformation, work rate, azimuth and inclination of the well, among others. The set of performance data, for example, may be stored on storage device(s) 508, for example.

After simulation, the set of performance data may then be visualized by the GUI 512 on the output device(s) 516. In one embodiment, the visual outputs may include tabular data of one or more performance parameters. Additionally, the outputs may be in the form of graphs and may be represented as ratios or percentages. A graphical visualization of the drill bit, blades, and/or cutters may be output. The graphical visualization (e.g., 2-D, 3-D, or 4-D) may include a color scheme.

Once presented with the set of performance data, the user may modify at least one BHA parameter, wellbore parameter, or drilling operating parameter. Modification may involve selecting a parameter from pre-existing values or inputting the parameter to obtain a modified BHA, wellbore, and/or drilling operation. The pre-existing values may depend on manufacturing capabilities or geometries of the components of the BHA.

After modification, a second simulation may be executed by the computing device 502. The second simulation may include the modified parameter to be simulated. The simulation may be executed by the computing device 502 using the processor(s) 506 to generate a second set of performance data. The drilling simulation may be performed using one or more of the methods set forth above.

Similar to the first simulation, the second simulation may include instructions to generate specific performance data, such as, but not limited to, surface torque, WOB, WOR, bit RPM, cutter forces, build up rate, dog leg severity, bending moment, walk rate, and/or contact forces. Additionally, the performance data may include bit geometry, ROP, alternative stress, percentage of fatigue life consumed, stick slip, borehole diameter, deformation, work rate, azimuth and inclination of the well, among others. The set of performance data, for example, may be stored on storage device(s) 508, for example.

Once generated, the initial set of performance data along with the second set of performance data may be presented using GUI 512 and output device(s) 516. The sets of performance data may be presented to the user for comparison and may be presented separately or combined. The sets of performance data may be presented or visualized using any tools known in the art, such as, for example, plots, graphs, charts, and logs.

Further, similar to the first and second simulation requests, a field BHA may be included in a field simulation to generate a set of field performance data. The computing device 502, using the GUI 512 and the output device(s) 516, is capable of presenting the any one of the set of field performance data, the first set of performance data, and the second set of performance data. The sets of performance data may be presented to the user for comparison and may be presented separately or combined. The sets of performance data may be presented using any presenting tools known in the art, such as, for example, plots, graphs, charts, and logs. Based on the performance data, a user may select a BHA or may modify one or more parameters of the one or more of the BHAs in hopes of achieving or designing an optimal BHA.

While the BHA is generally considered to include a drill bit, in the methods discussed below, the detailed interaction of the drill bit with the surface being drilled (e.g., casing, cement, earth formation, etc.) is generally considered separately. This separate consideration of the drill bit in detail allows for the interchangeable use of any drill bit model in the drilling tool assembly simulation as determined by the system designer. Drill bits used and modeled in one or more embodiments of the disclosure may include, for example, PDC bits, fixed cutter bits, roller cone bits, reamers, or any other cutting tool used during a drilling operation. One of ordinary skill in the art will appreciate that the drilling simulation method may consider the drill bit jointly with the drilling tool assembly without departing from the scope of the disclosure.

Figure 6:
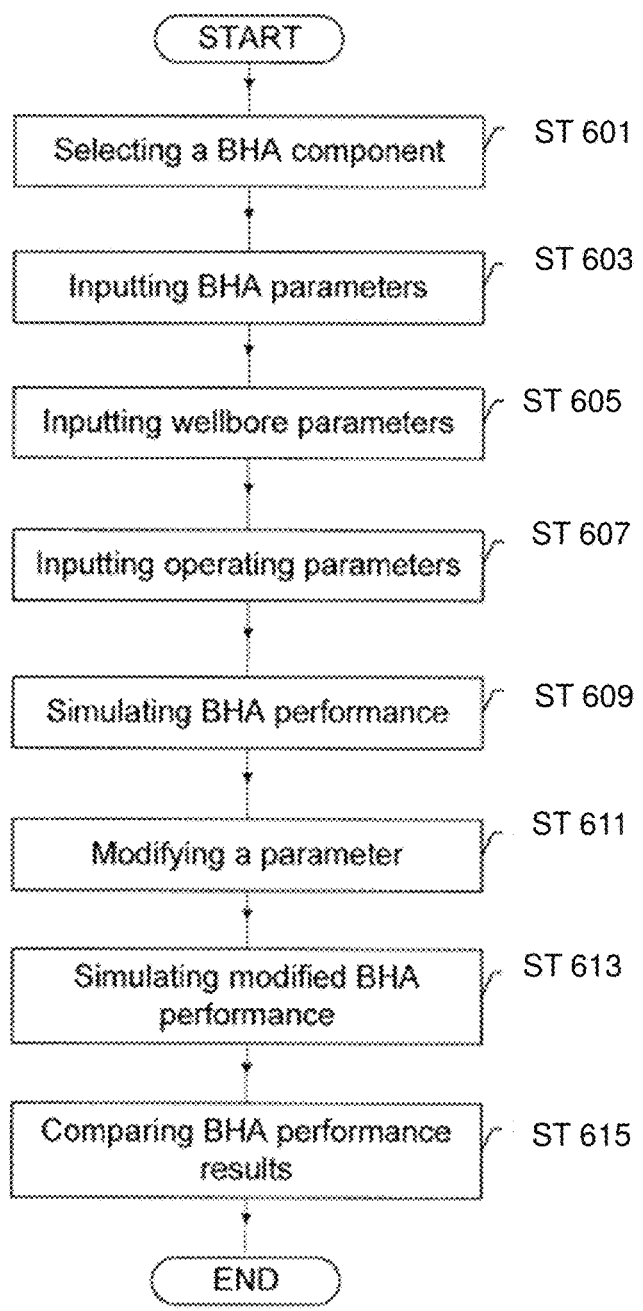
FIGS. 6-7 show methods in accordance with one or more embodiments of the present disclosure.

Referring now to FIG. 6, a method in accordance with one or more embodiments of the present invention is shown. In one or more embodiments, one or more of the stages shown in FIG. 6 may be omitted, repeated, and/or substituted. Accordingly, embodiments of selecting a BHA or designing a BHA should not be considered limited to the specific arrangements of modules shown in FIG. 6.

As shown in FIG. 6, a component of a BHA may be selected or input in stage 601. The component may be selected or input by an engineer using a GUI, such as GUI 512 in FIG. 5A. The component may include any number of BHA components and may include casing drilling string components such as pipes and/or collars, for example. After a BHA is selected or input, BHA parameters, wellbore parameters, and drilling operating parameters may be input in stages 603, 605, and 607, respectively. As described above, the parameters may be input using a GUI.

After the parameters are selected or input by an engineer, the drilling performance of the BHA package is simulated in stage 609. The simulation dynamically simulates the BHA package based on the parameters input or selected by the engineer in stages 601, 603, 605, and 607. After simulation, a number of performance outputs are generated. The simulation may visualize the outputs on a GUI such as GUI 512 as shown in FIG. 5A. In one or more embodiments, a number of performance outputs are reviewed by an engineer. The performance outputs may be reviewed and the BHA designer may modify a parameter of the BHA package, or other BHA packages may be similarly simulated in stage 613. The performance outputs of one or more BHA packages may be compared in stage 615. This process may be repeated until an optimal BHA package for a given drilling application has been selected.

Figure 7:
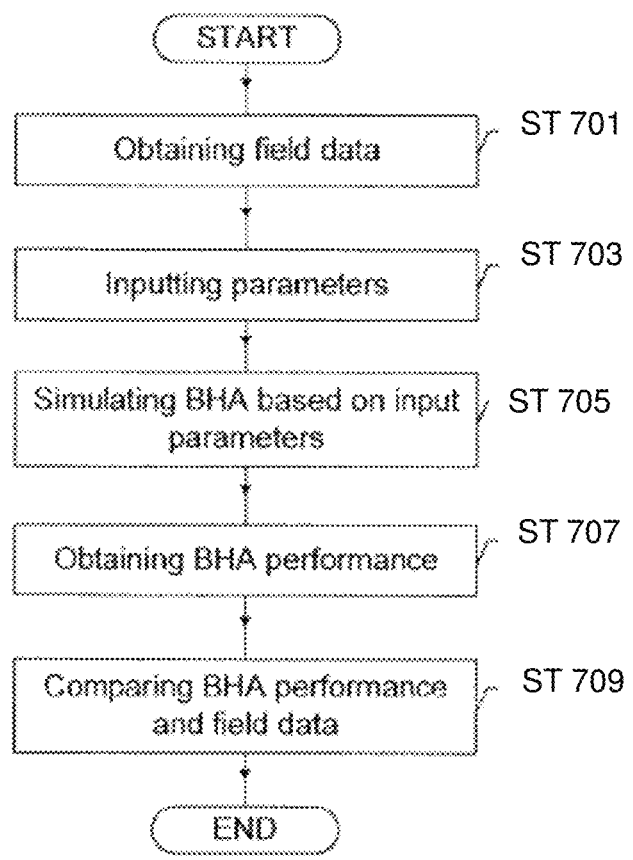

Referring now to FIG. 7, a method in accordance with one or more embodiments of the present invention is shown. In one or more embodiments, one or more of the stages shown in FIG. 7 may be omitted, repeated, and/or substituted. Accordingly, embodiments of selecting a BHA or designing a BHA should not be considered limited to the specific arrangements of modules shown in FIG. 7.

As shown in FIG. 7, field data may be obtained or acquired in stage 701. The field data may include any number of performance data, logging measurements, etc. In one or more embodiments, it may be advantageous for a designer to compare one or more performance parameters of one or more BHA packages to one another. Additionally, to design or select a desired BHA, a designer may be interested in simulated one or more BHA packages in a specific field environment. Furthermore, one or more BHA packages may be simulated in an environment specific to a given field in order to analyze a cause of BHA failure that may have occurred in the field. Accordingly, in one or more embodiments, a designer may input parameters based on specific field environments, as shown in stage 703. After parameters are input, the BHA package is simulated in stage 705 to obtain performance data corresponding to the BHA package in stage 707. The performance data obtained from the simulation in stage 705 may then be compared to data acquired in the field in stage 709.

Although not shown in FIG. 7, based on the comparison, a designer may review one or more sets of performance data. In addition, the designer may review performance data generated at a particular location along the BHA. For example, a designer may generate the contact force at a particular location or at a number of locations along the BHA. After reviewing the contact force, a designer may determine one or more locations in which contact force is at a maximum, local maximum, minimum, local minimum, and/or exceeds a given threshold. The threshold may be may be determined using a parameter sensitivity study (as in detail below). Those having ordinary skill in the art would know and appreciate that the generated performance data may be any performance data disclosed herein or any other data known in the art.

These one or more locations would be locations of concern that may cause a BHA to fail in the field. Accordingly, a designer may modify one or more parameters in hopes of designing a BHA package that minimizes contact force, among other performance parameters, at a particular location or locations along the BHA. This process may be repeated until a designer is satisfied with the generated performance output from the simulation of a BHA package.

The following examples illustrate methods for selecting and designing a BHA for one or more drilling operations and the performance results obtained from one or more systems of the present disclosure in accordance with one or more methods of the present disclosure. Those of skill in the art will appreciate that the following examples are for illustrative purposes and should not limit the scope of the present disclosure.

Figure 8:
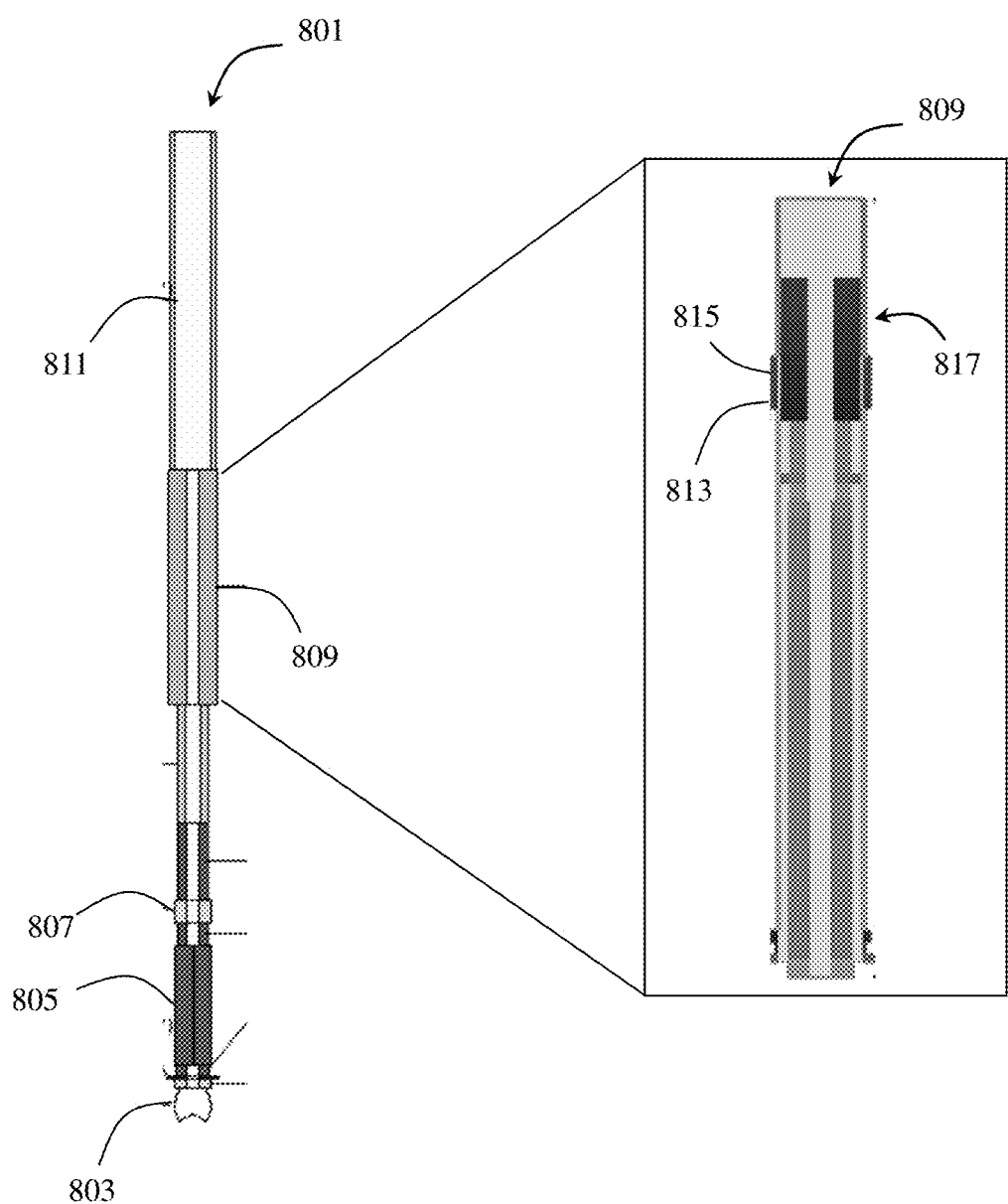
FIG. 8 shows simulation conditions in accordance with one or more embodiments of the present disclosure.

Turning to FIG. 8, embodiments of the present disclosure are shown. In FIG. 8, an example BHA 801 design is shown. The BHA 801 design has a number of components, such as stabilizers (stabs), drill bits, casing, reamers, subs, and other components known in the art. As understood by those of skill in the art, the BHA 801 is merely representative of the types of components that may be modeled, and no restriction on the scope of the disclosure is intended by reference to components that are or are not present.

In FIG. 8, the components and corresponding dimensions of each component of the BHA 801 are shown. In one or more embodiments, a drill bit 803 having a number of cutting elements (not shown) is located at the bottom of the BHA 801. Moving up BHA 801 (towards the surface), BHA 801 includes a reamer 805, a stabilizer 807, a casing profile nipple (CPN) locked to a drilling lock assembly (DLA) 809, and casing 811. An expanded view of CPN-DLA 809 is also shown and includes a torque lock 813, an axial lock 815, and a seal section 817. As mentioned above, the CPN on the casing string locks to the DLA on the BHA, and thus for purposes of the model, this component represents a constraint in the axial and lateral degrees of freedom in the model. Additional components of BHA 801 are also modeled. A list of the components illustrated in FIG. 8 may include a drill bit, a reamer, a float sub, a stabilizer, one or more non-magnetic drill collars (NMDC), an MWD tool, an internal stabilizer, a drill lock assembly (DLA) sub, a CPN, casing shoe, and casing. Those having ordinary skill in the art will appreciate that these are merely representative of BHA components and that more or less components may be included in the model, including any of the components discussed above and which may be used in casing drilling.

In one or more embodiments, it may be advantageous to simulate and compare one or more drill bits. For example, a 3D rendering of a first fixed-cutter drill bit including one or more blades, each blade having one or more cutters, may be compared with a 3D rendering of a second fixed-cutter drill bit having one or more blades, each blade having one or more cutters. The two drill bits may vary in terms of the number of blades, cutter layout, bit size, etc. A designer may input or select information or parameters to define the properties of each drill bit to be modeled.

Further, a well profile may be modeled in accordance with one or more embodiments of the present disclosure. A designer may input or select information about the well profile and produce an image showing various information. The designer may input information using a GUI, similar to that which is described above. In some embodiments, a vertical well may be modeled, where the well does not deviate in the north or south direction, nor does it deviate in the east or west direction. Additionally, the well may extend from point A to B vertically from the surface (A) to a depth of approximately 8000 feet (B). Further, other embodiments may use non-vertical wells having a deviation away from vertical towards a north or south and/or east or west direction. Further, as mentioned above, one or more wells may be drilled by directional drilling, and such directional wells (with the corresponding well parameters of inclination, hole direction, build rate, etc) may be modeled using the embodiments of the present disclosure One or more operating parameters used in simulating the well profile may include, but is not limited to, the depth of the well, the weight on bit (WOB), surface RPM, flow rate, mud weight, rock type, and uniaxial compressive strength (UCS). For example, a well profile may be simulated with a drilling depth of up to 8,000 ft (or about 2430 m), WOB of 5, 10, 15, and 20 klbs, surface RPM of 50, 80, 90 and 100 rpm, a fluid flow rate of about 600 gpm, and a mud weight of abut 14.5 ppg, drilling a shale rock type having an uniaxial compressive strength (UCS) of about 1 ksi. Thus, using the inputted BHA parameters, wellbore parameters, and operating parameter, the performance of the BHA in the wellbore at the operating conditions may result from the simulation of the BHA in the wellbore at those operating conditions.

Figure 9A:
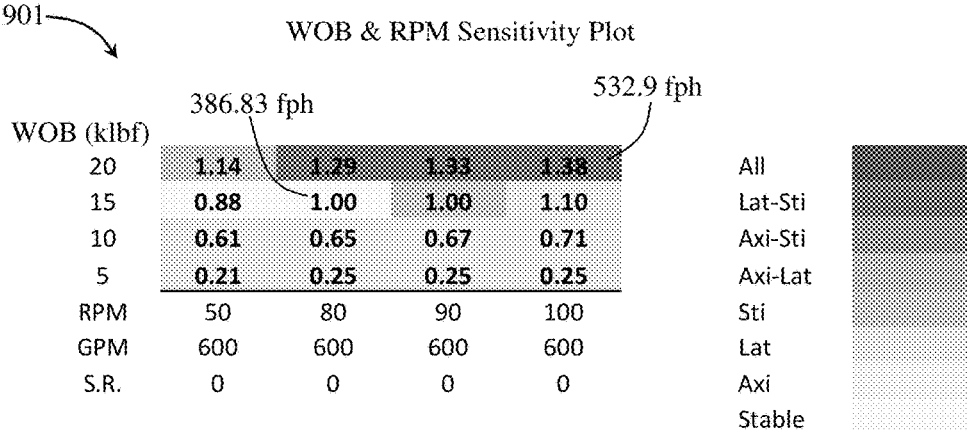
FIGS. 9A-9B show parameter sensitivity studies in accordance with one or more embodiments of the present disclosure.
Figure 9A:
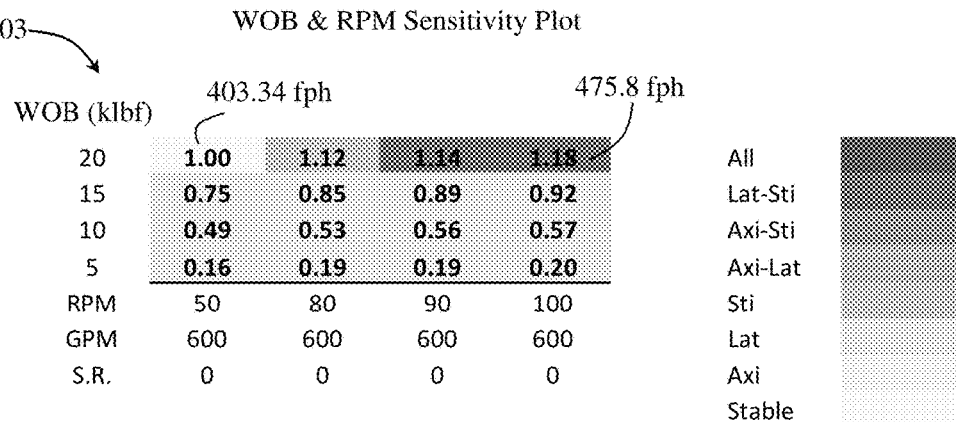
Figure 9B:
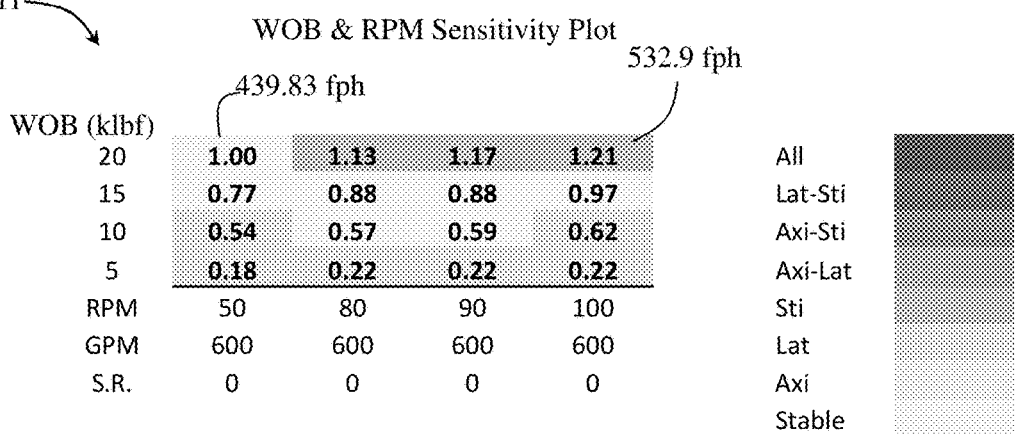
Figure 9B:
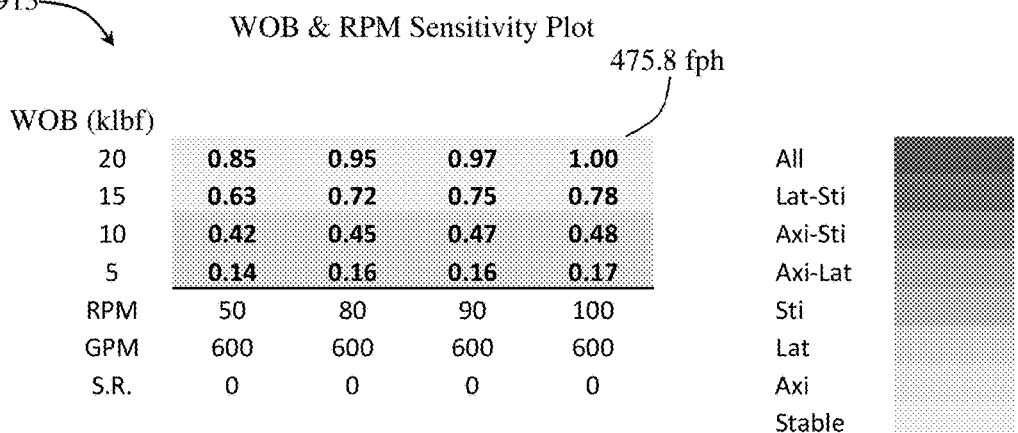

In one or more embodiments, it may be advantageous to determine the sensitivity of a parameter (BHA parameter, wellbore parameter, or operating parameter) and how particular parameters influence performance. Referring now to FIGS. 9A-9B, examples of parameter sensitivity plots are shown for two different fixed-cutter bits (one is a five bladed bit and the other a six bladed bit). The numbers in the illustrated parameter sensitivity plots are normalized ROP values. The highest ROP achieved while still having a smooth or stable drilling condition in which each vibration modes (axial, lateral, and stick-slip) are within the thresholds is used to normalize the ROP of the other parameters. This normalized ROP is noted below each parameter sensitivity chart. Using the normalized ROP, the simulated ROP may be calculated by multiplying the normalized ROP with the factor in the parameter sensitivity plots. As shown, different shades and/or colors may be used to illustrate different information, such as the types of vibrations present (above the threshold values).

A parameter sensitivity plot is generated based on a parameter matrix. Each axis (horizontal and vertical) may represent a different performance parameter. For example, the horizontal axis may be RPM and the vertical axis may be WOB. For each RPM and WOB (i.e., to obtain each value in the parameter matrix), a simulation is performed and results are collected. Using the collected results, other performance data are calculated. In the following examples, axial acceleration, lateral acceleration and stick slip are calculated. If any of the calculated performance data exceeds a threshold, the value or cell is shaded with a different color. As shown in the FIGS, some results are shaded the same shade (or color) and others are different shades (or colors). Each shade (or color) represents a given threshold exceeded. Analysis of such plots allow for a quick calculation of several performance data and whether specific design parameters are met.

A parameter sensitivity plot based on a first, five-bladed bit with a reamer is illustrated in plot 901. A parameter sensitivity plot based on a second, six-bladed bit and the reamer is illustrated in plot 903. Operating parameters may be considered safe when each of the three vibration indices (axial vibration, lateral vibration, and stick slip) are below the threshold values listed in chart 905. The threshold values may be determined by experimentation or may be estimated or pre-determined values input by the designer. According to plots 901 and 903, the first bit has a greater ROP (532.9 fph) than the second bit (475.8 fph) under the same parameters, but achieve such ROP values with lateral acceleration and stick-slip values that exceed the threshold values in 905. On the other hand, the second bit has a greater ROP (403.34 fph) than the second bit (386.83 fph) when the bit is stable (all vibration modes are within the threshold values in 905). Further, while this information has been shown in a 2D plot, it may also be plotted in any other manner, such as in a 3D bar graph Similar to FIG. 9A, FIG. 9B shows a parameter sensitivity plot using different threshold values (shown in 915) using the same bits/reamer as presented in FIG. 9A. The plot based on the bit and reamer for the first bit in plot 911. A parameter sensitivity plot for the second bit based on the bit and reamer is illustrated in plot 913. In addition, operating parameters may be considered safe when the three vibration indices, axial vibration, later vibration, and stick slip are below the threshold values listed in chart 915. As mentioned, the thresholds in chart 915 are different that those of chart 905 in FIG. 9A in order to better differentiate the two bits. Here, the first bit has a higher risk of stick-slip under high WOB. In some embodiments, parameter sensitivity plots may be generated for vibrations observed at other downhole components, such as at the CPN/DLA, casing shoe, etc., and such plots may be generated for changes to compare changes in various BHA and/or casing string components.

Figure 10A:
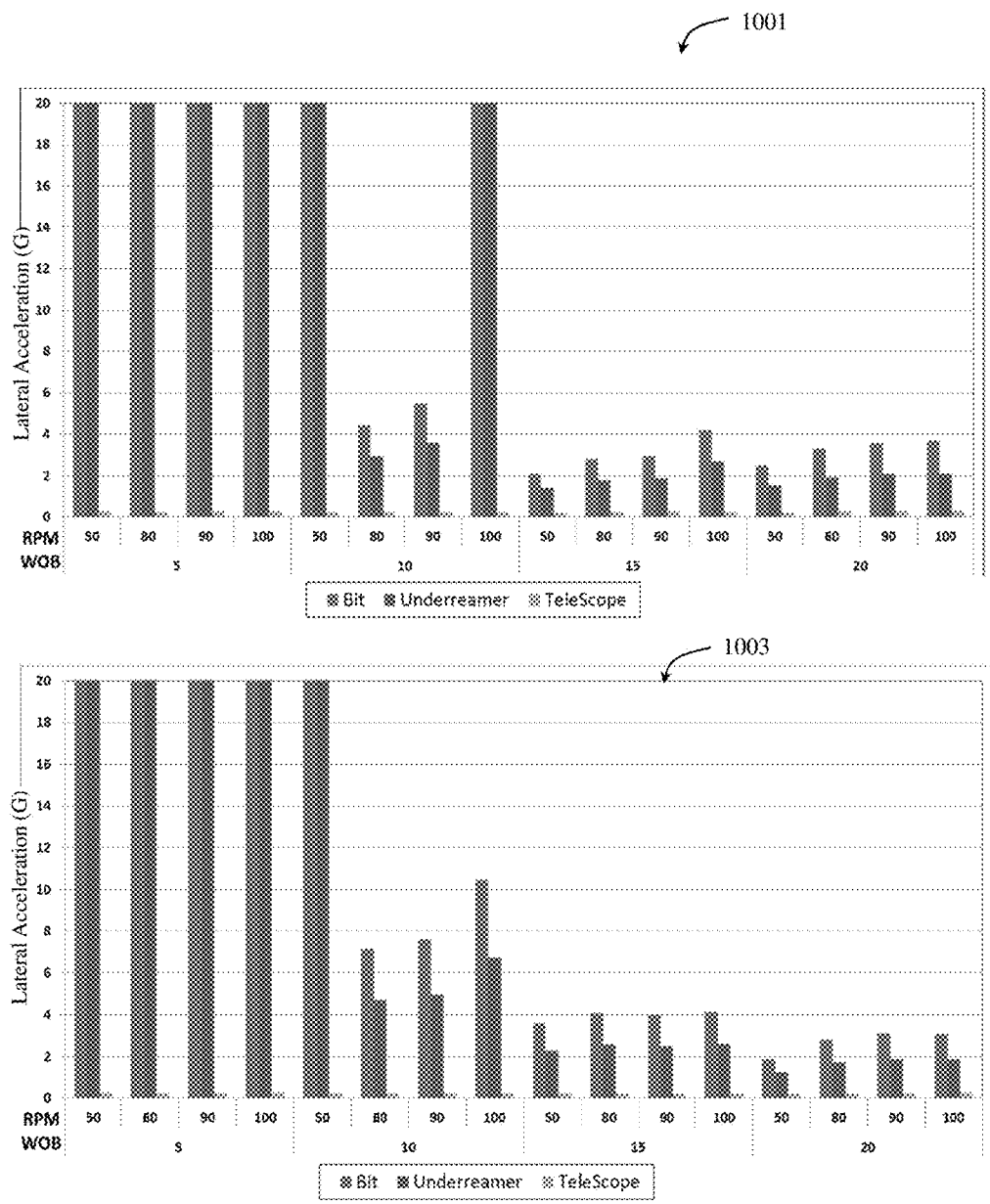
FIGS. 10A-10C show performance outputs in accordance with one or more embodiments of the present disclosure.
Figure 10B:
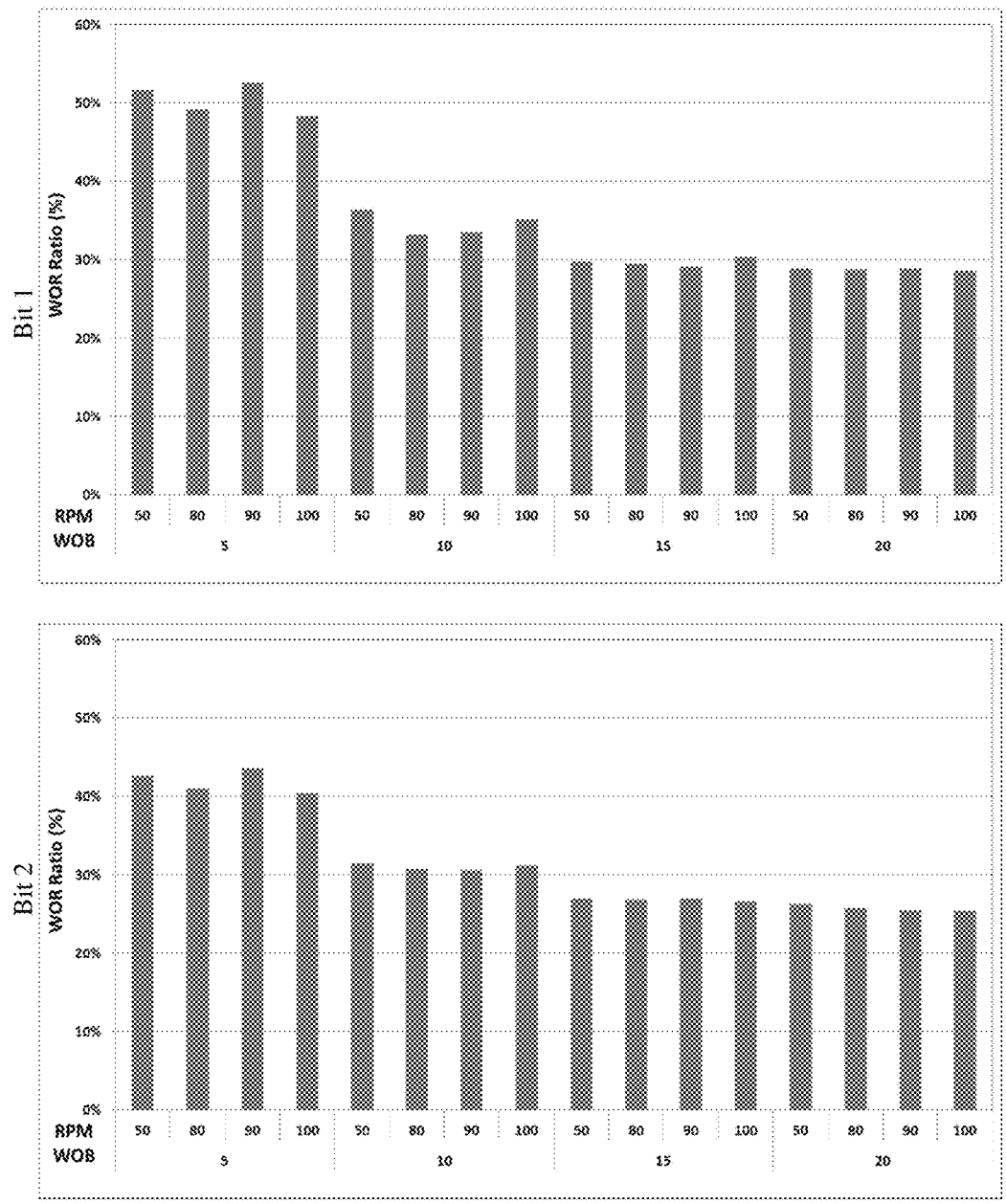

Referring now to FIGS. 10A-10B, performance results for two different fixed cutter drill bits are calculated and presented for comparison. Referring to FIG. 10A, in this example, 2D graphs of lateral acceleration at the drill bit, reamer, and MWD are shown. The lateral vibrations observed at each of these locations when drilling with the first, five-bladed drill bit is shown in graph 1001. Similarly, the second, six-bladed drill bit is shown in graph 1003. As shown, lower WOB and higher RPM causes a larger lateral acceleration. Further, while FIGS. 10A-10B show lateral accelerations observed at the bit, reamer, and MWD tool, it is also envisioned that axial accelerations and stick slip percentages may be presented at the bit, reamer, and MWD tool, and/or that any of the vibration modes may be plotted presented for what is observed at any BHA and/or casing string component FIG. 10B shows 2D graphs of WOR (weight on reamer) ratio of each drill bit. The WOR ratio may be determined by dividing the average WOR by the sum of the averages of the WOR and WOB. As shown, less weight is taken by the reamer as the WOB increases. Further, five-bladed bit 1 is more aggressive than six-bladed bit 2 and thus the reamer will take more weight as it works with five-bladed bit 1.

In some embodiments, 3D plots of the bottom hole pattern of at different locations along the drill string, for example, at the location of the cutting tools (e.g., at a bit and/or reamer) along the drill string, may be generated for comparison between two BHA and/or casing string components. Analyzing these patterns may be advantageous to determine whether bit whirl is present. Other graphs of other performance parameters may be generated to compare components having one or more different design parameters. For example, in some embodiments, at least one graph showing the lateral acceleration, torque, cutter normal forces, axial forces, lateral forces, neutral point location, well diameter drilled, lateral deformation, and/or contact force observed at or for different components along the BHA and/or casing string or even at the surface (such as for torque observed at the surface) may be used to compare such performance of the components with like-components having one or more different design parameters.

Figure 10C:
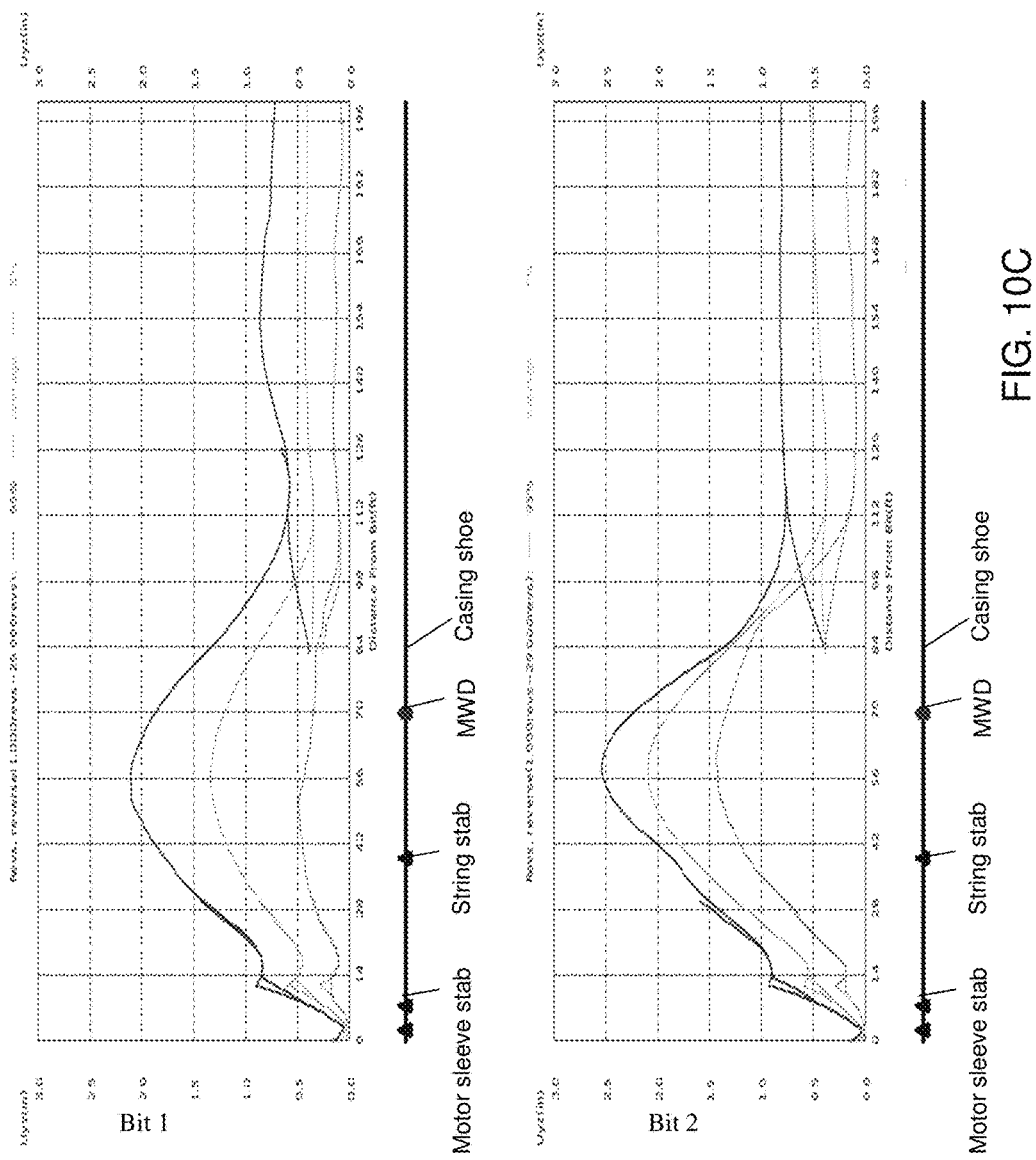

For example, referring to FIG. 10C, the lateral deformation (at 5%, average, and 95%) of the BHA and casing string (within 200 ft of the bit) at a particular WOB (20 klbf) and SRPM (50) for the five-bladed bit 1 and six-bladed bit 2 are shown. As shown, the casing string and BHA (between the CPN/DLA and casing shoe) have differing lateral deformations. Further, the lateral movements on the drill string stab and MWD are larger on the BHA that has bit 2 than bit 1. A similar type of plot showing the contact force (or any other of the above performance parameters) along the BHA and casing string within a selected distance from the bit may also be plotted to determine, for example, portions of the BHA that may come into contact with the wellbore and with what contact forces, for example. Further, with higher lateral deformations, even greater contact forces can be expected.

As mentioned above, performance results for one or more components of a BHA may be calculated and presented for comparison. For example, 2D graphs of lateral acceleration at the drill bit, reamer, MWD, CPN, and casing shoe of different BHAs may be generated to compare performance results of the BHAs. In some embodiments, 2D graphs of the surface torque and the bit RPM may be compared. From such graphs, surface torque and bit RPM may be related to the number of drill string revolutions. For example, in some embodiments, both the surface torque and bit RPM may be shown to decrease as the number of revolutions increases. The surface torque may be useful in determining whether the torque exceed rig capabilities. In addition, large torque variations may cause connection or component failure. According to some embodiments, drilling can be considered stable as the average vibration is less than 3 g for each parameter.

In some embodiments, 2D graphs of the neutral point location from the bit and the WOB and WOR may be generated using selected WOB and surface RPM input parameters. For example, the distance from a bit to a CPN may be determined to where the neutral point is close to the CPN and thus, include most of the casing in the tension zone.

In some embodiments, 2D graphs of the axial force at the axial lock and the torque at the torsion lock may be generated using selected WOB and surface RPM input parameters, which may show the averages and corresponding deviations of the axial force and torque. This information may be useful when determining whether loading is within certain thresholds for safe operation limits for the axial and torsional locks.

From the various parameter sensitivity studies performed and performance plots generated, optimal or recommend operating parameters (such as WOB and RPM) may be determined, for example, to reduce vibrations, stick-slip, etc. at various locations, including, for example, the casing string components such as CPN/DLA and casing shoe).

As described above, it may be advantageous to compare results of a simulation with data acquired in the field. Analysis of such a comparison could help determine failures or issues in the field and prevent further issues from arising in the future, among other reasons. In accordance with one or more methods and systems of the present disclosure, a designer may input parameters corresponding to a particular field environment. The designer may then input BHA parameters corresponding to the BHA that was used in the field, or may input different parameters to compare the performance outputs of one or more BHA packages to each other and/or to data acquired in the field.

Figure 11A:
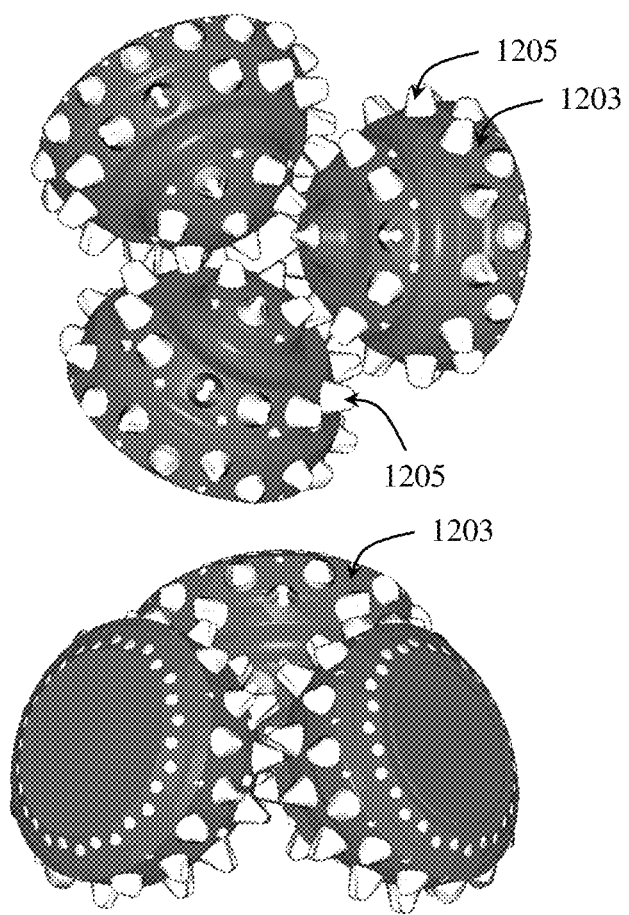
FIGS. 11A-11C show simulation conditions and outputs in accordance with one or more embodiments of the present disclosure.
Figure 11B:
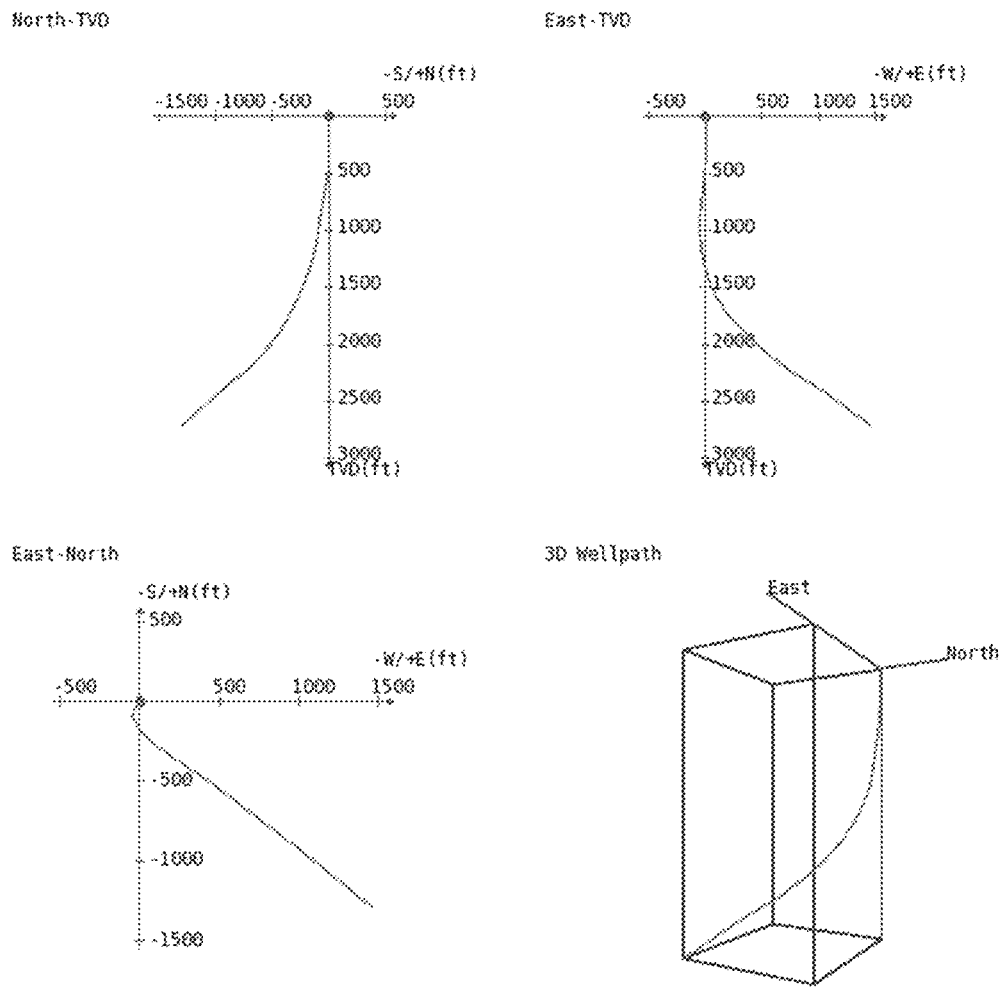
Figure 11C:
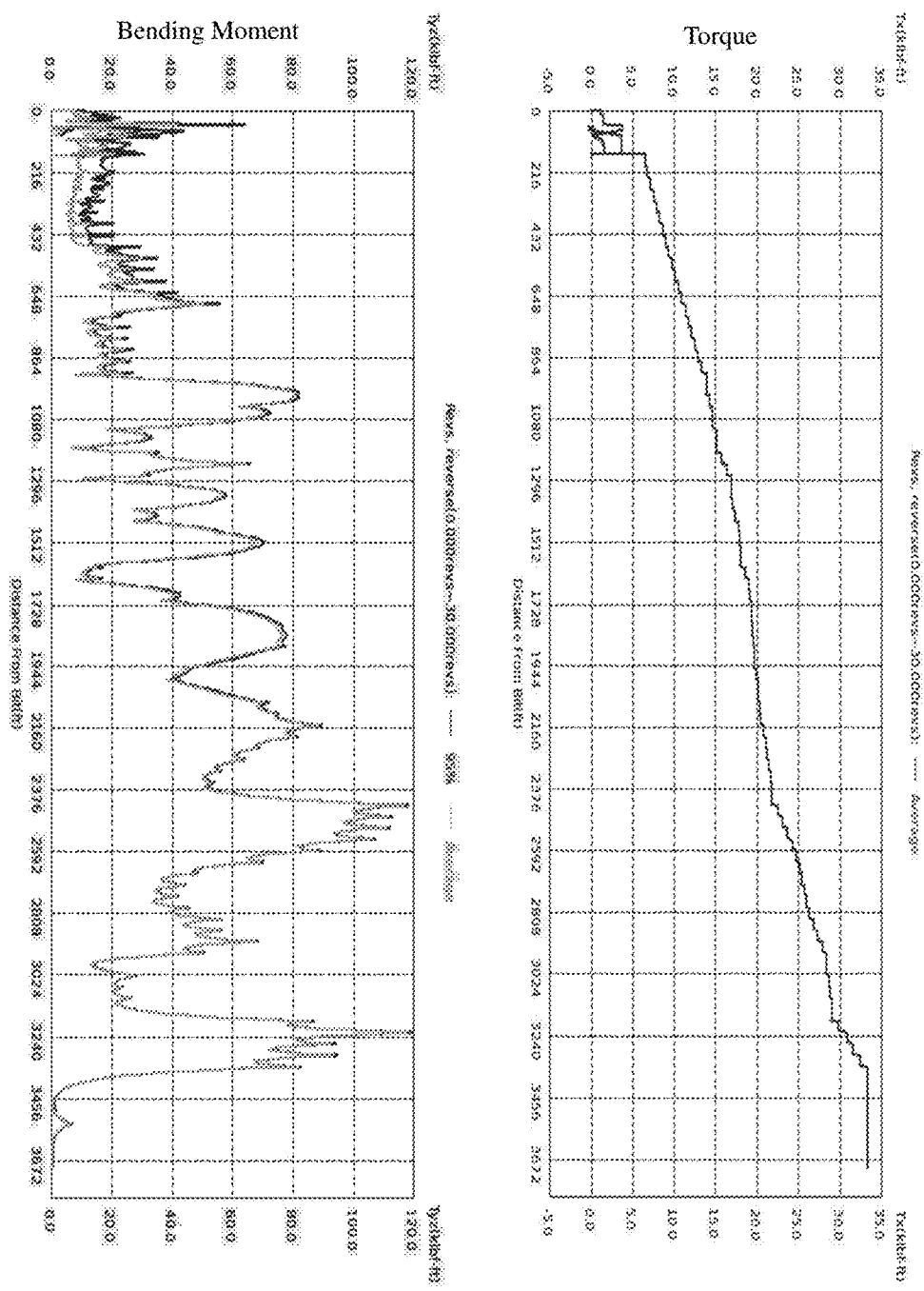

Referring now to FIGS. 11A-11C, embodiments of the present disclosure are shown. In this example, parameters corresponding to the field are input to be simulated and performance results are analyzed to determine the cause of a failure. In FIG. 11A, an example of a drill bit 1201 to be modeled is shown from different perspectives. The drill bit 1201 may include one or more cones 1203, each having one or more cutters 1205. Referring to FIG. 11B, an example well profile in accordance with one or more embodiments of the present disclosure is shown. The drill bit 1201 and well profile in FIG. 11B correspond to a drill bit and well profile used in the field. The designer inputs or selects information about the well profile and may input information using a GUI, similar to that which is described above.

Further, as mentioned above, a well profile in accordance with one or more embodiments of the present disclosure may be generated, where a designer inputs or selects information about the well profile and produces an image showing various information. The designer may input information using a GUI, similar to that which is described above. For example, a j-shaped or other directional well may be modeled, where the well does not deviate in the north or south direction, but slightly deviates in the east/west direction, vice versa, or any combination of directional deviation. Additionally, a 3D trajectory of the well may be plotted.

Using the well profile shown in FIG. 11B, dog leg severity (DLS) and inclination may be determined. DLS is the measure of how much the well bends over a particular distance (e.g., 100 ft) and is often measured in degrees per foot. A higher DLS measurement is often undesirable as it results in a higher bending moment and causes additional stress on the drill string, however, the point at which DLS becomes undesirable depends on the drilling string and casing. For instance, casing with a larger diameter would ideally operate in conditions with a lower DLS measurement than casing with small diameter as the smaller diameter casing can withstand a higher DLS without over-stressing the casing. In addition, certain materials may allow for higher DLS without over-stressing the casing. Accordingly, in this example, it is desired that DLS be less than 4°/100 ft. to prevent the possibility of failure. As shown in FIG. 11B, however, there are times when the DLS measurement is close to 7°/100 ft. Further, in some embodiments, the inclination of the well profile may also peak at over 60°.

Using the above well profile and drill bit, performance parameters may be output in order to determine a cause of failure. In FIG. 11C, torque and bending moment along the casing drilling string is shown. In one or more embodiments, at the surface (far right on each plot), data output from the simulation may be compared to data acquired in the field to ensure that the simulation is consistent. In this example, torque is approximately 34 klbf-ft. which is consistent with surface data acquired for the simulated scenario. In addition, the bending moment is considerably high across the casing drilling string which may be the cause of failure due to fatigue on the casing.

Figure 12A:
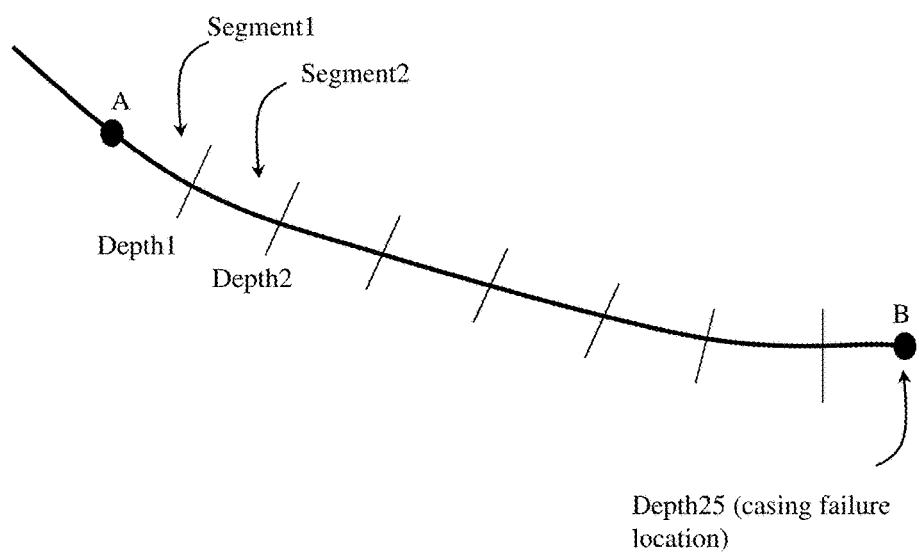
FIGS. 12-12D show simulation conditions and outputs in accordance with one or more embodiments of the present disclosure.

Fatigue is a gradually developed failure of the drill string, casing, and/or any other component along the drill string. Often times, it is caused by the continuous stress and/or forces applied to the drill string that occur during drilling. To analyze fatigue failure, it may be advantageous to break up the drill string into depth segments. Referring to FIG. 12A for example, in one or more embodiments, a simulation that is run to analyze the fatigue failure may be run from an initial depth (point A) to a final depth (point B) in which the final depth is often the point of failure as determined in the field. The total depth simulated may be broken up into two or more depth segments. In the example shown in FIG. 12A, depth at point A is 2779 ft. and depth at point B is 3702 ft. and the total simulation is broken up into 25 depth segments.

In each depth segment, the alternative stress amplitude on the casing may be calculated and the fatigue life consumption based on the actual revolutions spent in that segment. The alternative stress amplitude depends on the variation of stress and average stress. Both the alternative stress amplitude and the number of stress cycles affect the progression of fatigue. Generally, the fatigue life is the number of cycles of stress that a component of the drill string can withstand before failure and therefore, calculating the consumption of fatigue life in each depth segment may help identify portions of the drill string that may be more likely to fail and at what locations (depth and/or time locations) the failure is likely to occur.

Figure 12B:
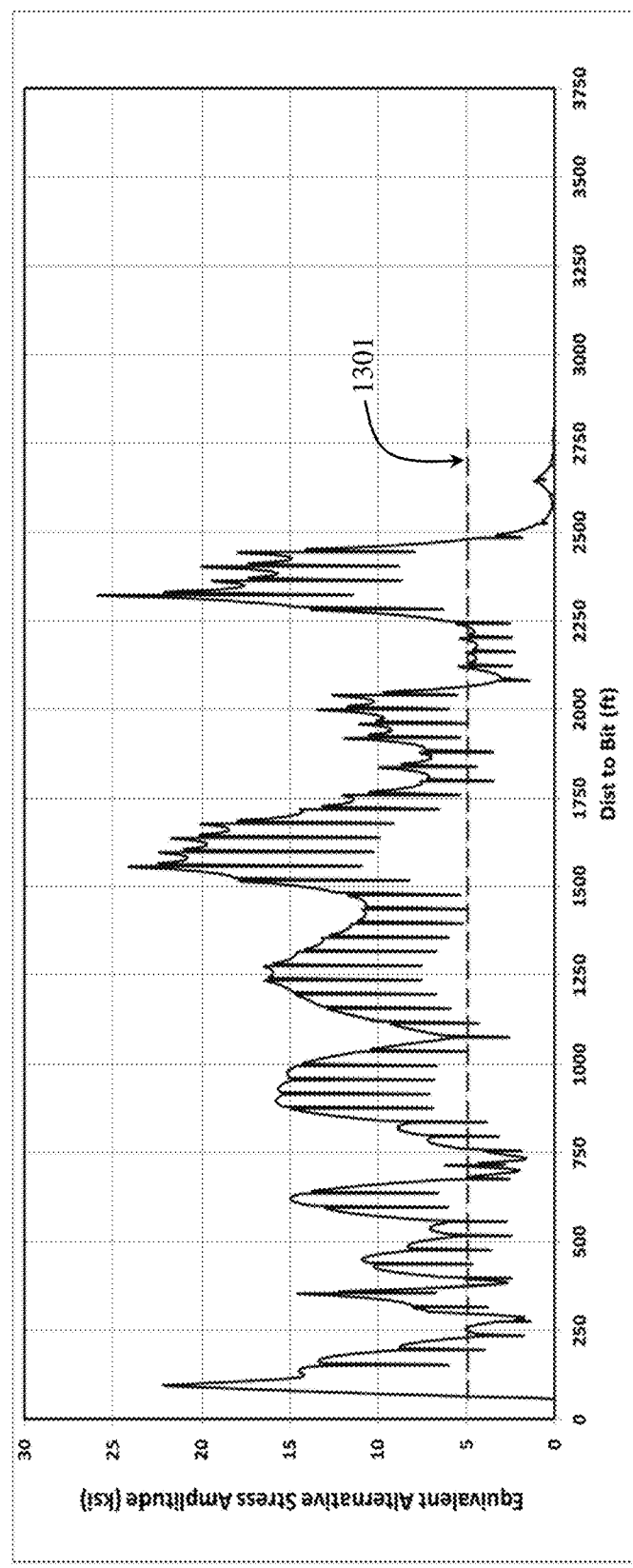

Referring now to FIG. 12B, equivalent alternative stress of the casing for a depth segment is calculated and plotted versus distance from bit. The stress may be calculated by beginning at a starting depth, drilling for a very short distance, then plotting the equivalent alternative stress along the BHA when drilling such a short distance. The endurance limit is shown as dashed line 1301 and indicates the maximum alternative stress level for a 95% survivability confidence. In other words, if the casing is subject to any alternative stress amplitudes below the endurance limit, the casing has less than a 5% chance of failure. In this case, the endurance limit has been determined through testing and experimentation with the casing, however, the endurance limit may also be known in the art based on the material and geometric properties of the casing or it may be determined or approximated using any calculations or equations known in the art.

Typically, in casing while drilling scenarios, the alternative stress of the casing has a greater chance of exceeding the endurance limit due to rotating of the casing string with a relatively large outer diameter through curved boreholes. In this example, using equation (1) below, results from endurance limit testing may also be used to calculate the number of stress cycles leading to fatigue failure.

$$N(h)=4.47\times10^{11}[2.9478 \cdot S_{equ\_amp}(h)]^{-4} \quad (1)$$

In equation (1), N is the number of cycles and $S_{equ\_amp}(h)$ is the stress amplitude at depth h. One may calculate the number of stress cycles N leading to fatigue failure at a given depth h and represents the maximum number of stress cycles that a casing at depth h can endure under the given stress level.

Assuming that the actual revolution spent in a segment is n, the fatigue life consumed during a particular segment is n/N(h). Using the above, the fatigue life consumption may be calculated at each depth segment and summed over the casing while drilling string to obtain total fatigue life consumption.

Figure 12C:
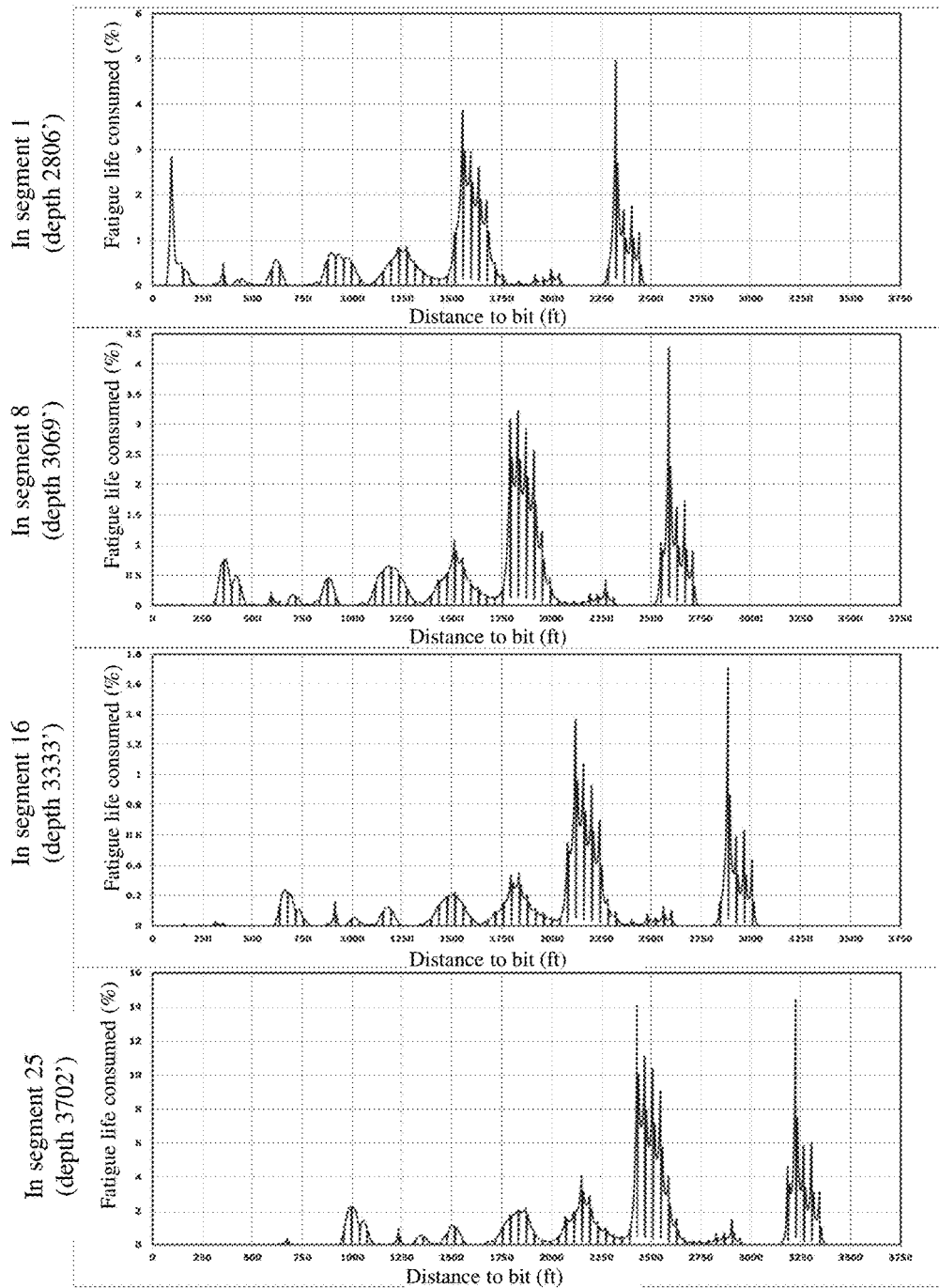
Figure 12D:
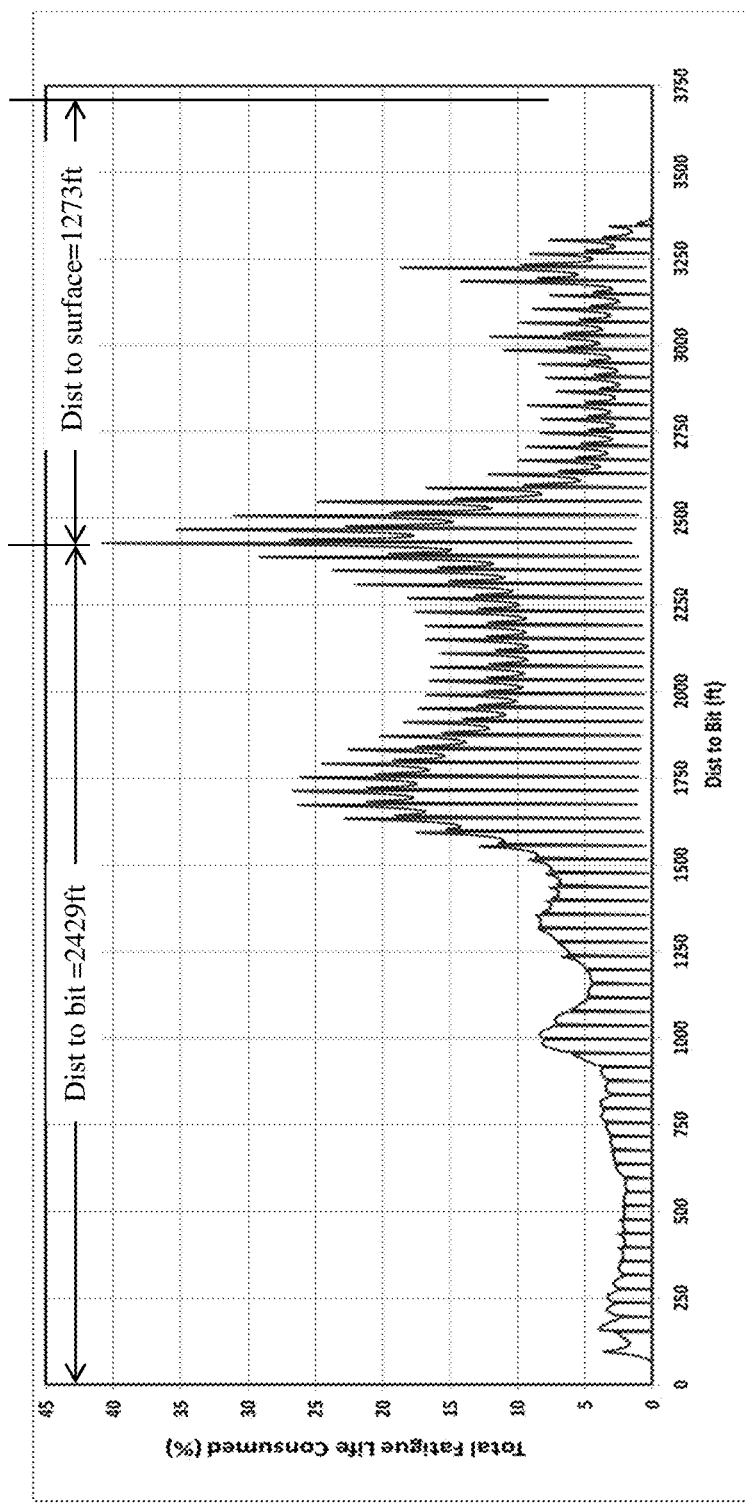

Referring now to FIGS. 12C-12D, fatigue life consumed is calculated and plotted with respect to distance from the bit. In FIG. 12C, the fatigue life consumed is shown for 4 of the 25 segments. As shown in FIG. 12D, the fatigue life of each of the 25 segments may be summed to obtain the total fatigue life consumed. In FIG. 12D, the max total fatigue life consumed is approximately 41% and occurs at approximately 1273 ft. from the surface. This corresponds with the field observations of failure at approximately 1270 ft.

In addition, or in the some embodiments, it may be advantageous to compare how a given drill string and/or BHA perform when casing while drilling in different types of rock. Further, in one or more embodiments, performance results may be output where one or more components are operating in one type of rock, while one or more components are operating in another type of rock. For example, in some embodiments, simulated results may be generated for an assembly having a drill bit operating in shale and a reamer operating in sandstone; an assembly having a drill bit and a reamer operating in sandstone; or an assembly having a drill bit and a reamer operating in shale. Using simulation methods of the present disclosure may allow a designer to determine rock conditions for resulting highest axial acceleration, highest lateral acceleration, highest reamer torque. For example, in some embodiments, a reamer axial acceleration, reamer lateral acceleration and reamer torque may be highest when both the bit and the reamer of a BHA operates in sandstone.

In some embodiments, simulations may be used to determine optimized operating parameters. For example, from some simulations, it may be determined that when drilling in shale, increasing the WOB may help stabilize the drilling. In some embodiments, simulations may be used to determine optimized cutter performance. For example, cutter work rate performance may be determined for both the drill bit and the reamer (work rate may be determined for each cutting element on the bit and/or reamer) of a BHA for two different RPM values. From the results, it may be determined that using a lower RPM may help reduce the cutter work rate.

Visual outputs that may be used in accordance with the present disclosure, in addition to those shown and described herein, include any output shown or described in any of in U.S. Pat. Nos. 6,516,293, 6,873,947, 7,844,426, 7,139,689, 6,785,641, 8,401,831, and 7,464,013 as well as U.S. patent application Ser. Nos. 10/749,019, 10/852,574, 10/851,677, 10/888,358, and 10/888,446, each of which are incorporated by reference in their entirety.

Embodiments of the present disclosure, therefore, allow a BHA designer to compare and contrast performance characteristics of one or more BHAs under various wellbore conditions and drilling operations. In selected embodiments, the present disclosure allows a BHA designer to review the performance of the BHA as a function of location along the BHA. By providing outputs that show performance as a function of length, the BHA designer can obtain information indicative of locations with high stress, high vibration, high accelerations, or other deleterious effects. The BHA designer can then add, remove, or move components on the BHA to improve, modify, or remove these deleterious effects. By allowing a designer to review locational information, the overall performance of the BHA may be improved.

In addition, the present disclosure allows a BHA designer to investigate the performance of multiple BHAs having a dynamic input. A dynamic input is an input that varies during the course of a simulation. For example, the RPM may be varied with the bit either drilling or not drilling to determine speed(s) to be avoided during drilling. Similarly, the weight on bit may be varied over the course of the simulation from 0 to a selected value, or between two higher values. Similarly, the rate of penetration of the BHA may be entered as a dynamic input, and allowed to change over the course of the simulation. By having a dynamic input, selected embodiments of the present disclosure may allow a BHA designer to suggest operating parameters to be avoided, or to be used by a driller when actually drilling a well.

Further, advantageously, embodiments of the present disclosure allows for a drilling engineer, or BHA designer, to efficiently select or modify a BHA to be used for drilling by providing a method and system by which various BHAs can be simulated and their performance analyzed. The simulation results, models, and data for comparing one or more BHAs (either to one another, to specific criteria, or to field tested BHA(s)) may help engineers determine an optimal or desirable BHA for use in drilling operations. Additionally, by analyzing various BHA parameters, a designer can select the optimal BHA for specific wellbore conditions and/or drilling operations based on one or more drilling performance parameters.

Software instructions in the form of computer readable program code to perform embodiments of the invention may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the invention. Further, portions of the systems and methods may be implemented as software, hardware, firmware, or combinations thereof.

Although only a few example embodiments have been described in detail above, those skilled in the art will readily appreciate that many modifications are possible in the example embodiments without materially departing from this disclosure. Accordingly, such modifications are intended to be included within the scope of this disclosure as defined in the following claims.

In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed:

1. has been amended as following:
A system for selecting a bottomhole assembly (BHA), comprising:
a computing device comprising a computing processor executing instructions to perform:
executing a first simulation to generate a first set of performance data, and executing a second simulation to generate a second set of performance data; and
the computing device comprising a graphical user interface executing on the computer processor with functionality to perform:
inputting a plurality of casing while drilling BHA parameters, a plurality of wellbore parameters, and a plurality of casing while drilling operating parameters,
presenting, on the graphical user interface, the first set of performance data from the first simulation, the first simulation based on the plurality of casing while drilling BHA parameters, the plurality of wellbore parameters, and the plurality of casing while drilling operating parameters, and the first set of performance data including drilling performance of at least one of casing string, a casing shoe, a casing profile nipple or a drilling lock assembly;
modifying, based on the first set of performance data, at least one parameter selected from the group consisting of the plurality of casing while drilling BHA parameters, the plurality of wellbore parameters, and the plurality of casing while drilling operating parameters, wherein modifying includes:
determining a plurality of rates of penetration corresponding to the BHA operating at a plurality of weight on bit (WOB) or weight on reamer (WOR) values and a plurality of rotation speeds;
determining axial vibration, lateral vibration, and stick-slip probability at the plurality of rates of penetration;
determining stability of a drilling process employing the BHA at the WOB or WOR values and the rotation speeds based on the determined axial vibration, lateral vibration, or stick-slip probability; and
adjusting the at least one parameter to obtain a modified parameter, based on the determined stability and rates of penetration
presenting, on the graphical user interface, the second set of performance data from the second simulation, the second simulation based on the modified parameter, and the second set of performance data including drilling performance of at least one of casing string, a casing shoe, a casing profile nipple or a drilling lock assembly; and
selecting a BHA based on the first and second sets of performance data.

2. The system of claim 1, wherein presenting further comprises:
visualizing, on the graphical user interface, at least one selected from the group consisting of the first set of performance data and the second set of performance data.

3. The system of claim 1, wherein at least one selected from the group consisting of the first set of performance data and the second set of performance data comprises at least one selected from the group consisting of rate of penetration (ROP), rotary torque, rotary speed, drilling tool assembly lateral, axial, or torsional vibrations and accelerations induced during drilling, weight on bit (WOB), weight on reamer (WOR), contact forces, torque, bending moment, alternative stress, percentage of fatigue life consumed, stick slip, dog leg severity, borehole diameter, deformation, work rate, azimuth and inclination of the well, build up rate, walk rate, and bit geometry.

4. The system of claim 1, wherein the at least one parameter is determined based on a parameter sensitivity study.

5. The system of claim 1, wherein the at least one parameter is a planned well profile designed to prevent high dog leg severity.

6. The method of claim 1, wherein the dynamic simulation performed as part of the first simulation or as part of the second simulation is a transient time simulation based on at least one of the casing while drilling BHA parameters, wellbore parameters, or operating parameters varying as a function of time or rotational position of at least a portion of a drilling assembly that includes the BHA.

7. A method for selecting a bottomhole assembly (BHA), comprising:
inputting casing while drilling BHA parameters, wellbore parameters, and casing while drilling operating parameters;
performing a dynamic simulation of a first BHA based on the casing while drilling BHA parameters, wellbore parameters, and casing while drilling operating parameters;
presenting a first set of performance data of the first BHA calculated from the dynamic simulation, wherein the first set of performance data includes drilling performance of at least one of casing string, a casing shoe, a casing profile nipple or a drilling lock assembly, and wherein the first set of performance data is at least partially calculated by:
determining a plurality of rates of penetration corresponding to the BHA operating with a plurality of weight on bit (WOB) or weight on reamer (WOR) values and a plurality of rotation speeds;
determining axial vibration, lateral vibration, and stick-slip probability at the plurality of rates of penetration; and
determining stability of a drilling process employing the BHA at the WOB or WOR values and the rotation speeds based on the determined at least one of axial vibration, lateral vibration, or stick-slip probability;
modifying, based on the first set of performance data, at least one parameter selected from the group consisting of casing while drilling BHA parameters, wellbore parameters, and casing while drilling operating parameters, wherein modifying involves changing a value of the at least one parameter to obtain a modified parameter;

performing a dynamic simulation of a second BHA based on the modified parameter;

presenting a second set of performance data calculated from the dynamic simulation of the second BHA, the second set of performance data including drilling performance of at least one of casing string, a casing shoe, a casing profile nipple or a drilling lock assembly; and selecting a BHA based on the first and second sets of performance data.

8. The method of claim 7, wherein the dynamic simulation comprises simulating at least one selected from the group consisting of a casing drilling string and a liner drilling string.

9. The method of claim 7, wherein a drill bit of the first BHA is dynamically simulated in a first rock type and a reamer of the first BHA is dynamically simulated in a second rock type.

10. The method of claim 7, wherein at least one selected from the group consisting of the first set of performance data and second set of performance data comprises at least one selected from a group consisting of rate of penetration (ROP), rotary torque, rotary speed, drilling tool assembly lateral, axial, or torsional vibrations and accelerations induced during drilling, weight on bit (WOB), weight on reamer (WOR), contact forces, torque, bending moment, alternative stress, percentage of fatigue life consumed, stick slip, dog leg severity, borehole diameter, deformation, work rate, azimuth and inclination of the well, build up rate, walk rate, and bit geometry.

11. The method of claim 10, wherein the percentage of fatigue life consumed is calculated by analyzing alternative stress in a plurality of depth segments of a drill string.

12. The method of claim 7, further comprising:
obtaining field data and comparing field data to the first set of performance data;
modifying, based on the comparison, at least one parameter selected from the group consisting of casing while drilling BHA parameters, wellbore parameters, and casing while drilling operating parameters, wherein modifying involves changing a value of the at least one parameter to obtain a modified parameter;
performing a dynamic simulation of a second BHA based on the modified parameter; and
presenting a second set of performance data calculated from the dynamic simulation of the second BHA; and
selecting a BHA based on the first and second sets of performance data.

13. The method of claim 7, further comprising:
obtaining a plurality field data corresponding to a field environment, wherein the inputted plurality of casing while drilling BHA parameters, wellbore parameters, and casing while drilling operating parameters correspond to the field environment; and
comparing the first set of performance data to the plurality of field data.

14. The method of claim 13, wherein comparing comprises reviewing the first set of performance data and the plurality of field data to determine a cause of failure.

15. The method of claim 14, wherein the cause of failure is determined to be at a location along the BHA in which the first set of performance data exceeds a given threshold.

16. The method of claim 13, wherein comparing comprises determining a location in which the first set of performance data is at least one selected from the group consisting of a minimum, a local minimum, a maximum, and a local maximum.

17. The method of claim 7, wherein performing the first dynamic simulation comprises dynamically varying the inputs as a function of time or rotational position of at least a portion of a drilling assembly including the BHA.

* * * * *